United States Patent
Han et al.

(10) Patent No.: US 7,838,372 B2
(45) Date of Patent: Nov. 23, 2010

(54) METHODS OF MANUFACTURING SEMICONDUCTOR DEVICES AND STRUCTURES THEREOF

(75) Inventors: Jin-Ping Han, Fishkill, NY (US); Jong Ho Yang, Fishkill, NY (US); Chung Woh Lai, Singapore (SG); Henry Utomo, Newburgh, NY (US)

(73) Assignees: Infineon Technologies AG, Neubiberg (DE); Chartered Semiconductor Manufacturing, Ltd., Singapore (SG); International Business Machines Corporation, Armonk, NY (US); Samsung Electronics Co., Ltd., Suwon-Si, Gyeonggi-Do (KR)

( * ) Notice: Subject to any disclaimer, the term of this patent is extended or adjusted under 35 U.S.C. 154(b) by 231 days.

(21) Appl. No.: 12/125,238

(22) Filed: May 22, 2008

(65) Prior Publication Data

US 2009/0289379 A1    Nov. 26, 2009

(51) Int. Cl.
*H01L 21/336* (2006.01)
(52) U.S. Cl. .................... 438/300; 438/42; 438/44; 438/360; 438/363

(58) Field of Classification Search .................. 438/42, 438/44, 300, 360, 363
See application file for complete search history.

(56) References Cited

U.S. PATENT DOCUMENTS

| | | | |
|---|---|---|---|
| 7,402,496 B2 * | 7/2008 | Liu et al. ..................... 438/300 |
| 7,410,859 B1 * | 8/2008 | Peidous et al. .............. 438/231 |
| 2006/0261436 A1 * | 11/2006 | Turner et al. ................. 257/506 |
| 2008/0026518 A1 * | 1/2008 | Su et al. ...................... 438/197 |
| 2008/0061327 A1 * | 3/2008 | Kuo et al. .................... 257/288 |
| 2008/0145982 A1 * | 6/2008 | Ko et al. ...................... 438/164 |
| 2008/0191244 A1 * | 8/2008 | Kim et al. .................... 257/190 |
| 2008/0233361 A1 * | 9/2008 | Imanishi ................... 428/195.1 |
| 2008/0277699 A1 | 11/2008 | Chakravarthi et al. |
| 2009/0191675 A1 * | 7/2009 | Mehrad et al. .............. 438/218 |
| 2009/0209097 A1 * | 8/2009 | Schulz et al. ................ 438/638 |

* cited by examiner

*Primary Examiner*—Zandra Smith
*Assistant Examiner*—Jae Lee
(74) *Attorney, Agent, or Firm*—Slater & Matsil, L.L.P.

(57) ABSTRACT

Methods of manufacturing semiconductor devices and structures thereof are disclosed. In one embodiment, a method of manufacturing a semiconductor device includes forming recesses in a first region and a second region of a workpiece. The first region of the workpiece is masked, and the recesses in the second region of the workpiece are filled with a first semiconductive material. The second region of the workpiece is masked, and the recesses in the first region of the workpiece are filled with a second semiconductive material.

22 Claims, 17 Drawing Sheets

METHODS OF MANUFACTURING SEMICONDUCTOR DEVICES AND STRUCTURES THEREOF

TECHNICAL FIELD

The present invention relates generally to the fabrication of semiconductor devices, and more particularly to methods of manufacturing semiconductor devices and structures thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

Complementary metal oxide semiconductor (CMOS) devices utilize both positive and negative channel transistor devices in complementary configurations. The positive and negative channel devices of CMOS devices are typically referred to as p channel metal oxide semiconductor (PMOS) field effect transistors (PFETs) and n channel metal oxide semiconductor (NMOS) field effect transistors (NFETs), for example. A PFET is formed in an n well (e.g., a well implanted with n type dopants) and an NFET is formed in a p well. An isolation region such as a shallow trench isolation (STI) region is formed between the n well and p well of the PFET and the NFET, respectively.

What are needed in the art are improved methods of fabricating semiconductor devices including transistors and structures thereof.

SUMMARY OF THE INVENTION

These and other problems are generally solved or circumvented, and technical advantages are generally achieved, by embodiments of the present invention, which provide novel methods of manufacturing semiconductor devices and structures thereof.

In accordance with an embodiment of the present invention, a method of manufacturing a semiconductor device includes forming recesses in a first region and a second region of a workpiece. The first region of the workpiece is masked, and the recesses in the second region of the workpiece are filled with a first semiconductive material. The second region of the workpiece is masked, and the recesses in the first region of the workpiece are filled with a second semiconductive material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in CMOS device applications. Embodiments of the invention may also be implemented in other semiconductor applications such as memory devices, logic devices, and other applications that utilize transistor devices, for example.

In some transistor applications, it is desirable to introduce stress to the channel region of the transistor in order to increase the mobility of semiconductor carriers such as electrons and holes. However, in CMOS devices, PFETs and NFETs require different types of stress in the channel region; e.g., a PFET would benefit from compressive stress in the channel region, and an NFET would benefit from tensile stress in the channel region. Thus, what are needed in the art are methods of creating different types of stress in channel regions of PFETs and NFETs of CMOS devices.

Embodiments of the present invention providing novel methods of manufacturing semiconductor devices and structures thereof. Recesses are formed in a workpiece, and the recesses are filled with semiconductive materials. The semiconductive materials are different in some regions than in other regions of the workpiece. The semiconductive materials in the recesses may comprise source and drain regions of transistors, for example, to be described further herein.

In a less preferred embodiment of the invention, PFETs and NFETs may be formed by masking PFET regions of a workpiece using a lithography mask and process, and forming recesses in the NFET regions for source and drain regions of the NFETs. Using a separate lithography mask and process, NFET regions of the workpiece are masked, and recesses are formed in the PFET regions for source and drain regions of the PFETs. The source and drain regions of the NFETs and PFETs may be filled with different semiconductive materials comprising different amounts or types of stress for the NFETs and PFETs. However, in this embodiment, the recesses in the PFET regions and the recesses in the NFET regions may comprise different depths within the workpiece, because two different lithography processes are used to form the recesses for the PFETs and NFETs. Some recesses may be over-recessed, resulting in decreased device performance or device failures. Furthermore, a misalignment of the two lithography masks used to mask the workpiece can occur, also leading to device failures.

Figure 1:
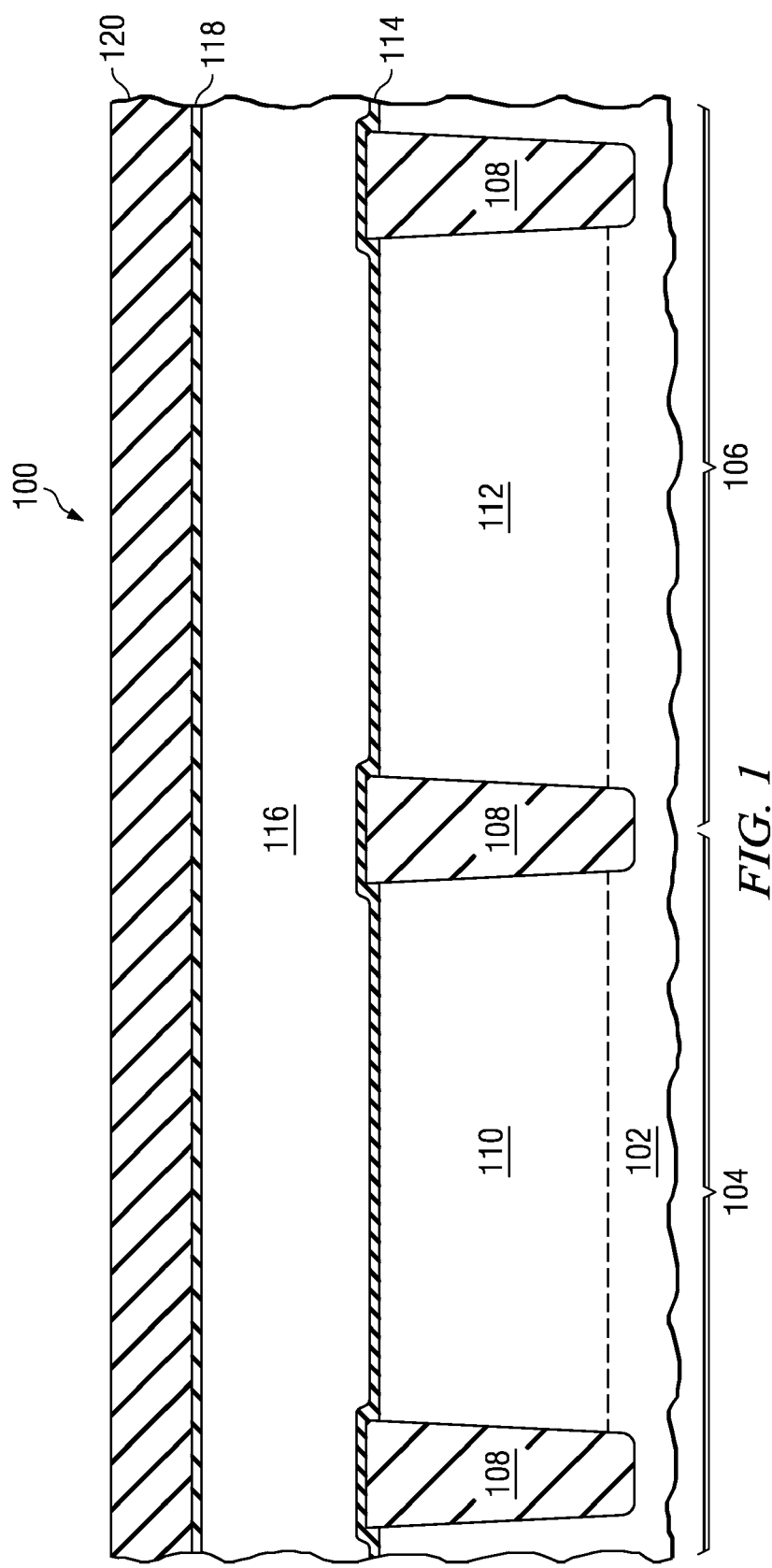
FIGS. 1 through 14 show cross-sectional views of a semiconductor device at various stages of manufacturing in accordance with an embodiment of the present invention, wherein source and drain regions of transistors in a first region and a second region of a workpiece are recessed using an anisotropic etch process and filled with semiconductive materials.

In accordance with embodiments of the present invention, advantageously, source and drain regions of PFETs and NFETs of CMOS devices are formed simultaneously, requiring no lithography masks or processes to form the recesses and ensuring that the recesses comprise the same shape and dimension for PFET and NFET devices. FIGS. 1 through 14 show cross-sectional views of a semiconductor device 100 at various stages of manufacturing in accordance with an embodiment of the present invention. Referring first to FIG. 1, to manufacture the semiconductor device 100, a workpiece 102 is provided. The workpiece 102 may include a semiconductor substrate, body, or wafer comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The workpiece 102 includes a first region 104 and a second region 106 proximate the first region 104. The first region 104 may comprise a region where an NFET device 144 (not shown in FIG. 1; see FIG. 14) will be formed, and the second region 106 may comprise a region where a PFET device 146 will be formed, to be described further herein.

Referring again to FIG. 1, isolation regions 108 are formed in the workpiece 102. The isolation regions 108 may comprise shallow trench isolation (STI) regions, deep trench (DT) isolation regions, field oxide isolation regions, or other insulating regions, as examples. The isolation regions 108 may be formed by depositing a hard mask (not shown) over the workpiece 102 and forming trenches in the workpiece 102 and in the hard mask using a lithography process. For example, the isolation regions 108 may be formed by depositing a photoresist, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is removed, and the trenches are then filled with an insulating material such as an oxide or nitride, or multiple layers and combinations thereof, as examples. The hard mask may then be removed. Alternatively, the isolation regions 108 may be formed using other methods and may be filled with other materials. At least one isolation region 108 may be formed between the first region 104 and the second region 108, as shown. The isolation regions 108 may comprise a top surface that extends above a top surface of the workpiece 102 by several nm, as shown.

A p well 110 is formed in the first region 104 of the workpiece 102, and an n well 112 is formed in the second region 106 of the workpiece 102. The p well 110 may be formed in the first region 104 by masking the second region 106 and implanting p type dopants into the first region 104, for example. Likewise, the n well 112 may be formed in the second region 106 by masking the first region 104 and implanting n type dopants into the second region 106.

A gate dielectric material 114 is deposited over the workpiece 102, the isolation regions 108, the p well 110 and the n well 112. The gate dielectric material 114 may comprise about 50 nm or less of an oxide such as $SiO_2$, a nitride such as $Si_3N_4$, a high-k dielectric material having a dielectric constant greater than 3.9, or combinations and/or multiple layers thereof, as examples. Alternatively, the gate dielectric material 114 may comprise other dimensions and materials, for example. The gate dielectric material 114 may be formed using chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used.

A gate material 116 is deposited over the gate dielectric material 114. The gate material 116 may comprise a gate electrode material. The gate material 116 may comprises about 150 nm or less of a semiconductor material and/or a metal. The gate material 116 may comprise polysilicon, amorphous silicon, a silicide, a metal, and/or combinations or multiple layers thereof, as examples. Alternatively, the gate material 116 may comprise other dimensions and materials, for example. The gate material 116 may be formed by CVD, PVD, or other suitable deposition methods, for example. The gate material 116 may optionally be implanted with dopants; e.g., the gate material 116 may be pre-doped or may be doped later, at the same time source and drain regions are implanted with dopants.

A hard mask 118/120 is deposited over the gate material 116. The hard mask 118/120 may comprise a nitride material such as silicon nitride, an oxide material such as silicon dioxide, a nitridized oxide, or multiple layers and combinations thereof, for example, although alternatively, the hard mask 118/120 may comprise other materials. In some embodiments, the hard mask 118/120 may comprise an oxide layer 118 and a nitride layer 120 disposed over the oxide layer 118, for example, as shown. A plurality of alternating silicon dioxide layers and silicon nitride layers may be used for the hard mask 118/120, to provide etch selectivity and etch stop layers for subsequent etch processes, for example. The hard mask 118/120 may prevent the formation of semiconductive material in subsequent processing steps over the gate material 116, for example. The hard mask 118/120 may comprise about 100 nm or less of silicon nitride and/or silicon dioxide, although alternatively, the hard mask 118/120 may comprise other dimensions and materials.

Figure 2:
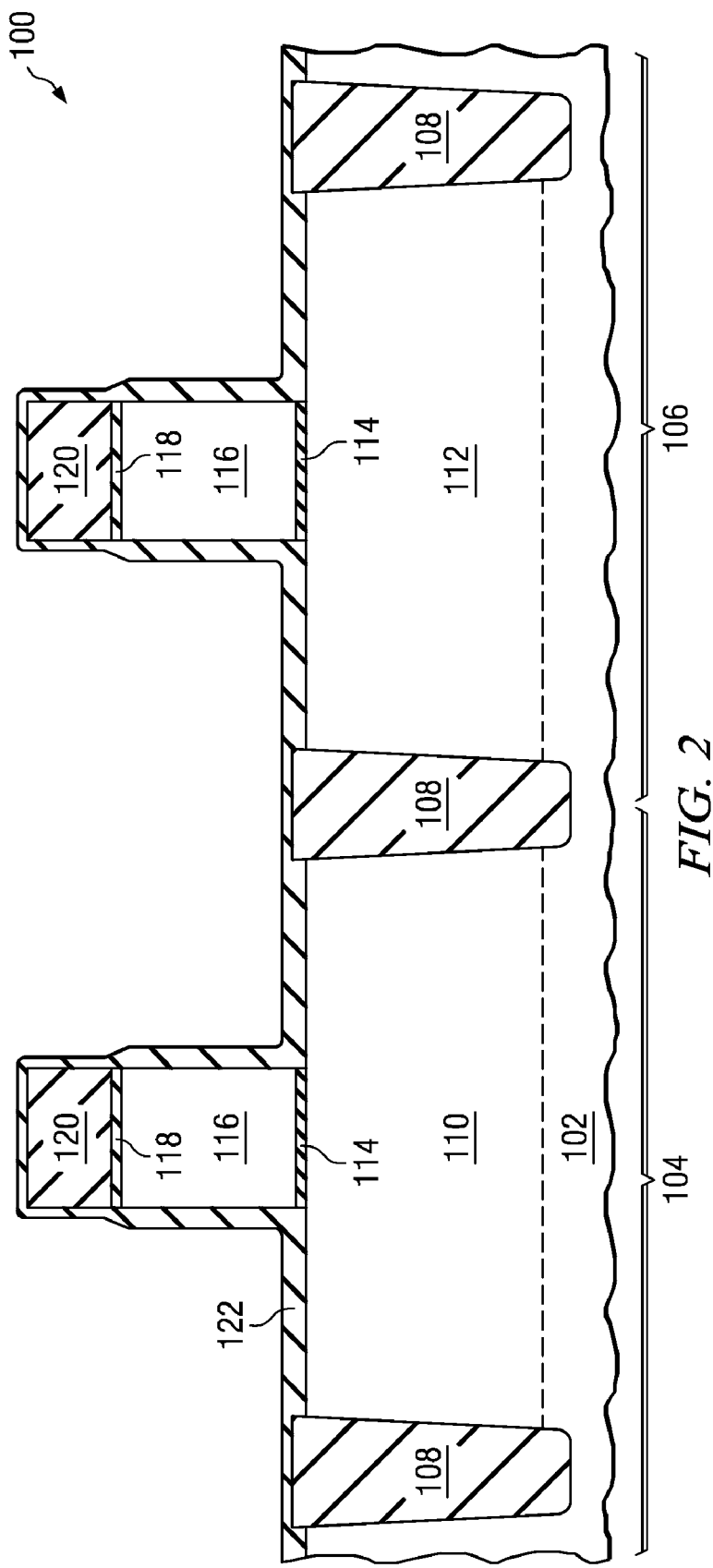

The hard mask 118/120, the gate material 116, and the gate dielectric material 114 are patterned using lithography to form a gate 116 and gate dielectric 114 with a patterned hard mask 118/120 residing on top in the first region 104 and the second region 106 of the workpiece 102, as shown in FIG. 2. For example, a layer of photosensitive material (not shown) comprising a photoresist, for example, may be deposited over the hard mask 118/120. The layer of photosensitive material is patterned with the desired pattern for the gate 116 and gate dielectric 114, and the patterned layer of photosensitive material and optionally also the hard mask 118/120 are used as a mask to pattern the gate 116 and the gate dielectric 114, leaving the patterned hard mask 118/120, gate 116, and gate dielectric 114 disposed over the workpiece 102, as shown in FIG. 2. The layer of photosensitive material is then removed. The top portion of the hard mask 118/120 may comprise a nitride cap 120 for the gate 116 material, for example.

The gates 116 may comprise a width or a gate length of about 35 to 42 nm in some embodiments, for example. The gates 116 may extend lengthwise, e.g., in and out of the paper, by about 500 nm. Alternatively, the gates 116 may comprise other dimensions depending on the particular application and the technology node used for the manufacturing of the semiconductor device 100, for example.

The gate 116 in the first region 104 of the workpiece 102 comprises a gate 116 of an NFET device 144, and the gate 116 in the second region 106 of the workpiece 102 comprises a gate 116 of a PFET device 146 in some embodiments, for example.

The workpiece 102 may be lightly doped with a dopant species to form lightly doped regions (not shown) in a top surface of the workpiece 102 proximate the gate 116 and gate dielectric 114, after the patterning of the hard mask 118/120, gate 116, and the gate dielectric 114. Other implantation processes (e.g., pocket implants, halo implants, or double-diffused regions) may optionally also be performed as desired after the patterning of the hard mask 118/120, the gate 116, and the gate dielectric 114, for example. However, in accordance with some embodiments of the present invention, implantation processes may not be required.

Figure 3:
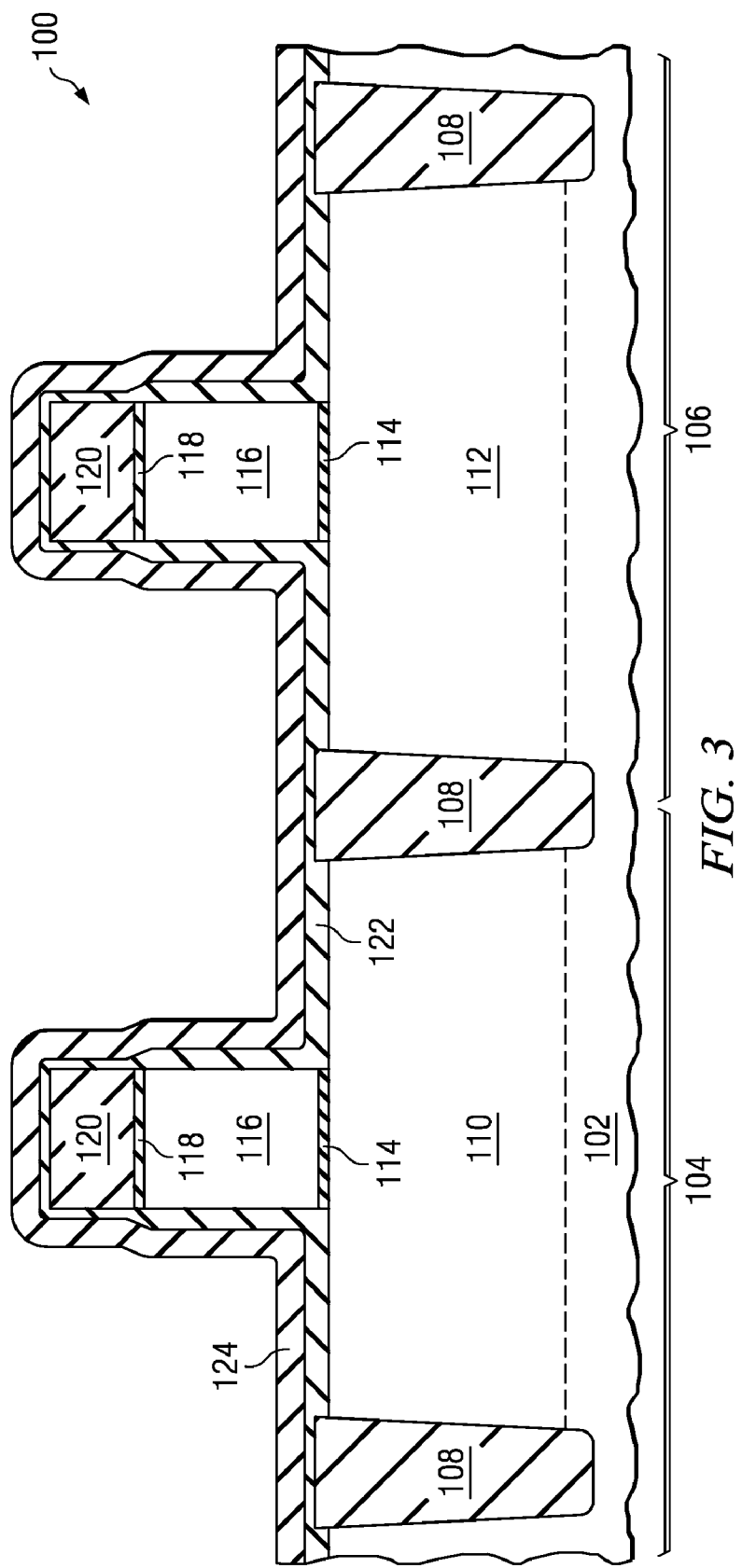

A sidewall spacer material 122/124 is formed over the top surface of the hard mask 118/120, the workpiece 102, and the isolation regions 108, and over the sidewalls of the gate 116, gate dielectric 114, and hard mask 118/120, as shown in FIGS. 2 and 3. The sidewall spacer material 122/124 may comprise one or more liners and may comprise two or more layers of insulating material, e.g., such as silicon nitride, silicon oxide, and/or silicon oxynitride, although other materials may also be used. The sidewall spacer material 122/124 may comprise an oxide liner 122, as shown in FIG. 2, and a nitride layer 124 disposed over the oxide liner 122, as shown in FIG. 3, in some embodiments, as an example. The oxide liner 122 may be formed by an oxidation process and may be thicker over semiconductive materials such as the sidewalls of the gate 116 and the top surface of the workpiece 102 than over the nitride cap 120 of the hard mask 118/120, as shown. The oxide liner 122 may comprise a thickness of about 20 nm or less, as an example. The nitride layer 124 may be substantially conformal as-deposited, for example. The nitride layer 124 may comprise a thickness of about 8 to 20 nm, as an example. Alternatively, the nitride layer 124 and the oxide liner 122 may comprise other dimensions.

Figure 4:
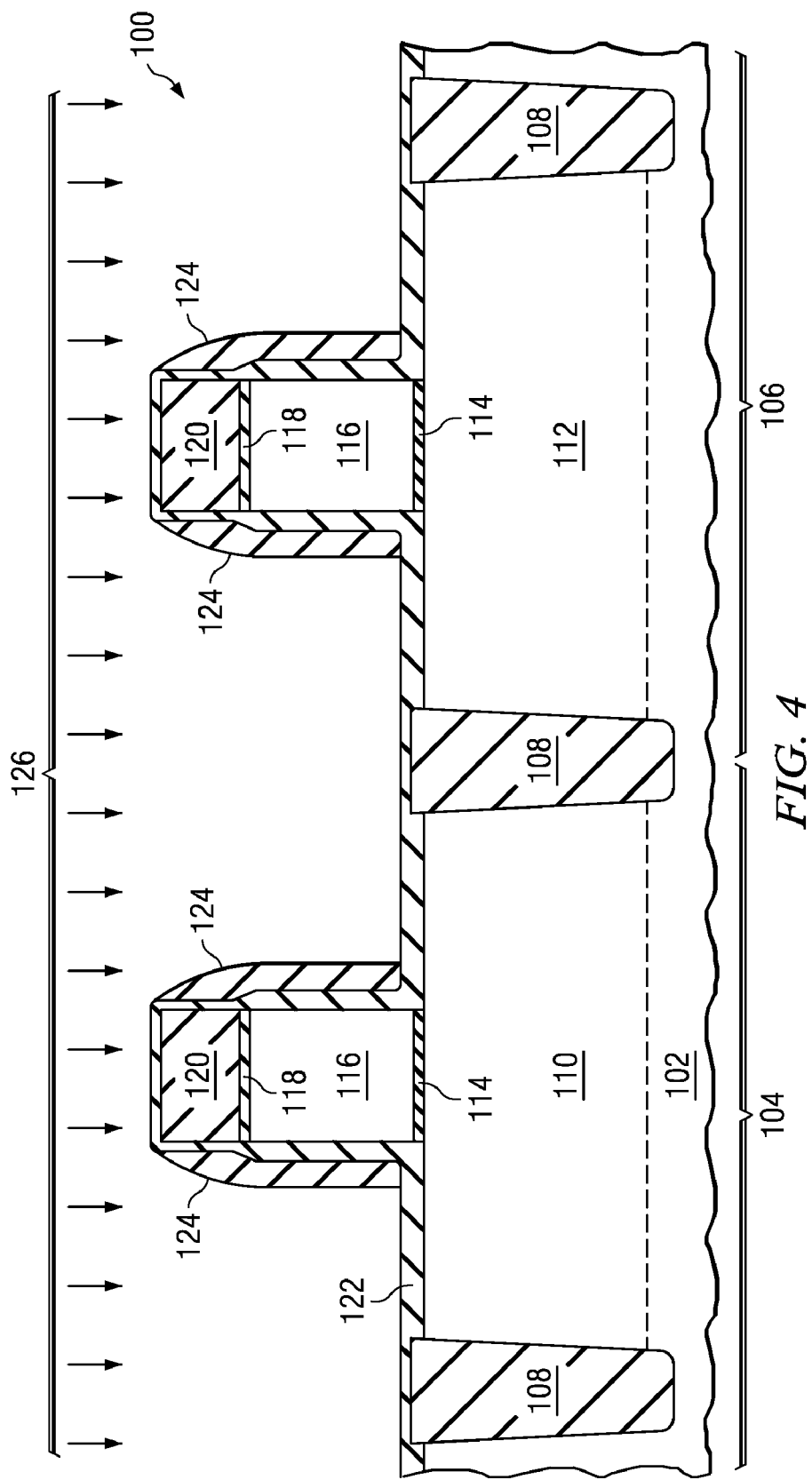
Figure 5:
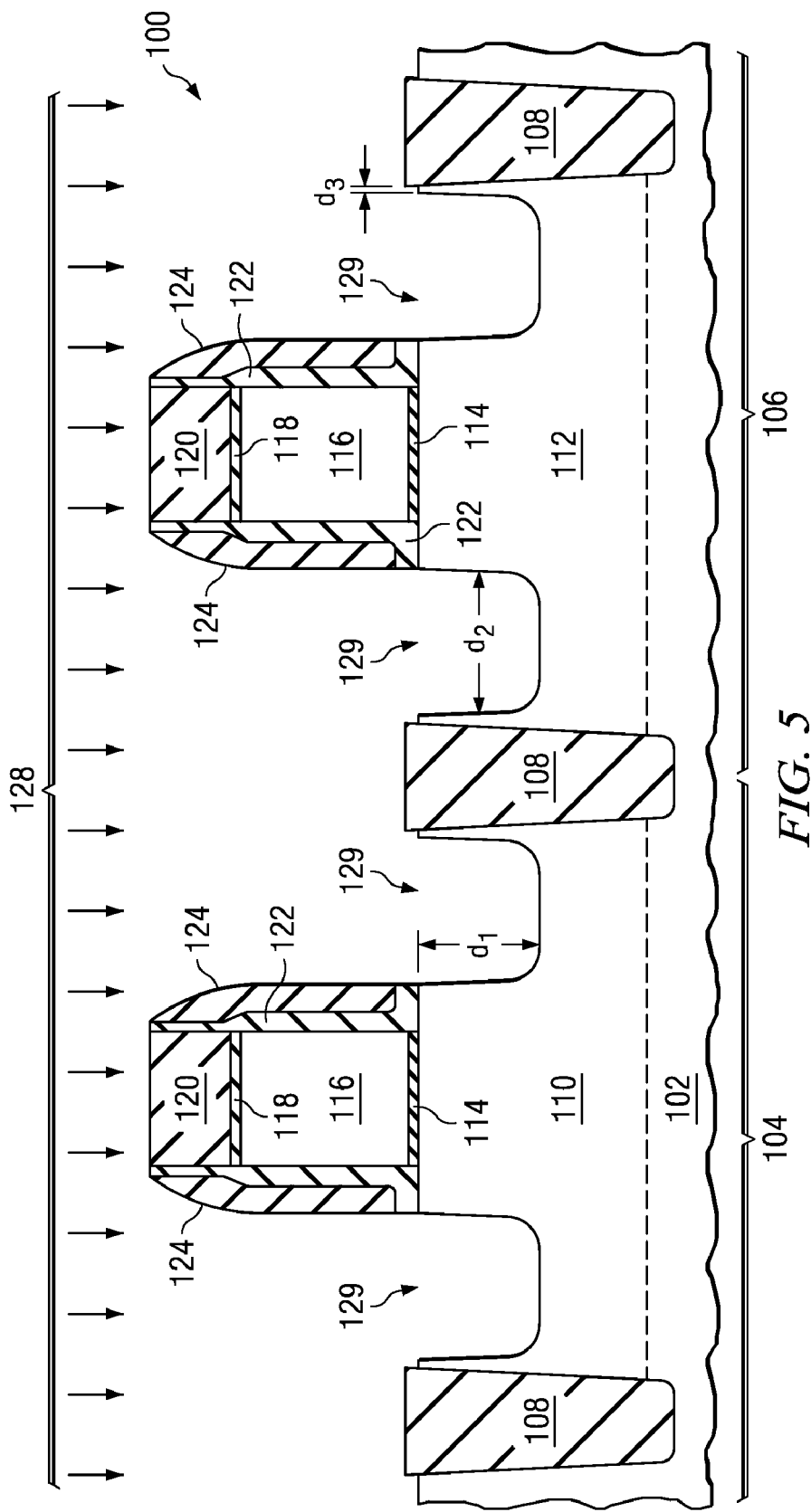

The sidewall spacer material 122/124 is etched using an anisotropic or directional etch process 126 to form sidewall spacers 122/124 on the sidewalls of the gate 116, gate dielectric 114, and hard mask 118/120, as shown in FIGS. 4 and 5. The anisotropic etch process 126 removes the sidewall spacer material 122/124 from the top surfaces of the hard mask 118/120, the workpiece 102, and the isolation regions 108, leaving sidewall spacers 122/124 disposed on the sidewalls of the hard mask 118/120, gate 116, and gate dielectric 114. The anisotropic etch process 126 may comprise a dry reactive ion etch (RIE) adapted to etch the nitride material 124 and the oxide material 122 preferentially from top surfaces, for example. The etch process 126 initially etches away the nitride layer 124, as shown in FIG. 4, and the etch process 126 may be altered and/or continued to remove the oxide liner 122, as shown in FIG. 5. The sidewall spacers 122/124 may comprise downwardly-sloping sidewalls due to the anisotropic etch process 126, for example. The sidewall spacers 122/124 may comprise a thickness along the sidewalls of the gate 116 of about 10 to 15 nm, although alternatively, the sidewall spacers 122/124 may comprise other dimensions.

After the formation of the sidewall spacers 122/124, optionally, the workpiece 102 may be implanted with a deep implantation of a dopant species proximate the first sidewall spacers 122/124, not shown. Channel regions are formed in the workpiece 102 beneath the gates 116, e.g., beneath the gate dielectric 114.

Figure 15:
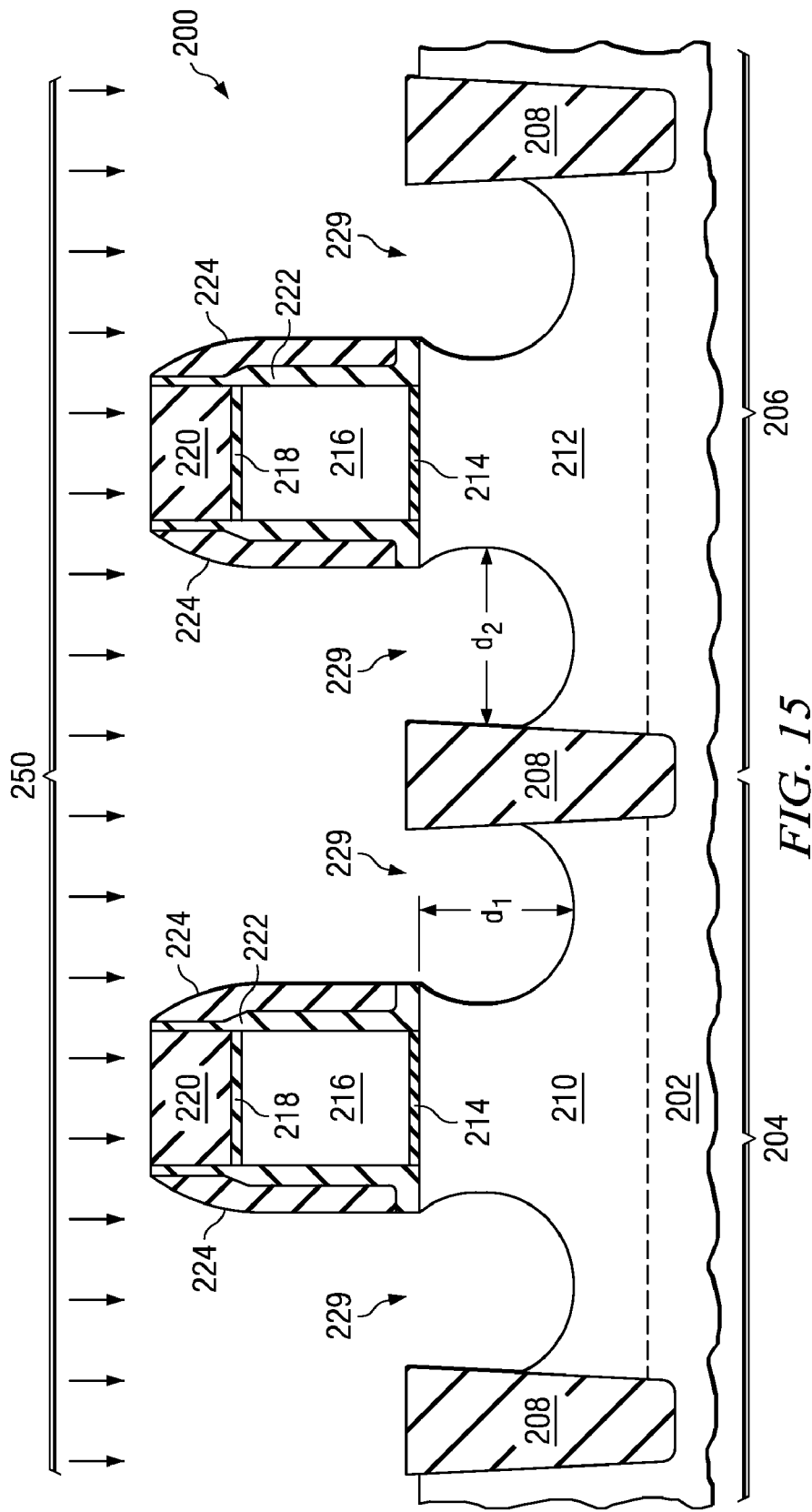
FIGS. 15 through 17 show cross-sectional views of a semiconductor device in accordance with another embodiment of the present invention, wherein the etch process used to recess the workpiece in the source and drain regions comprises an isotropic etch process.
Figure 16:
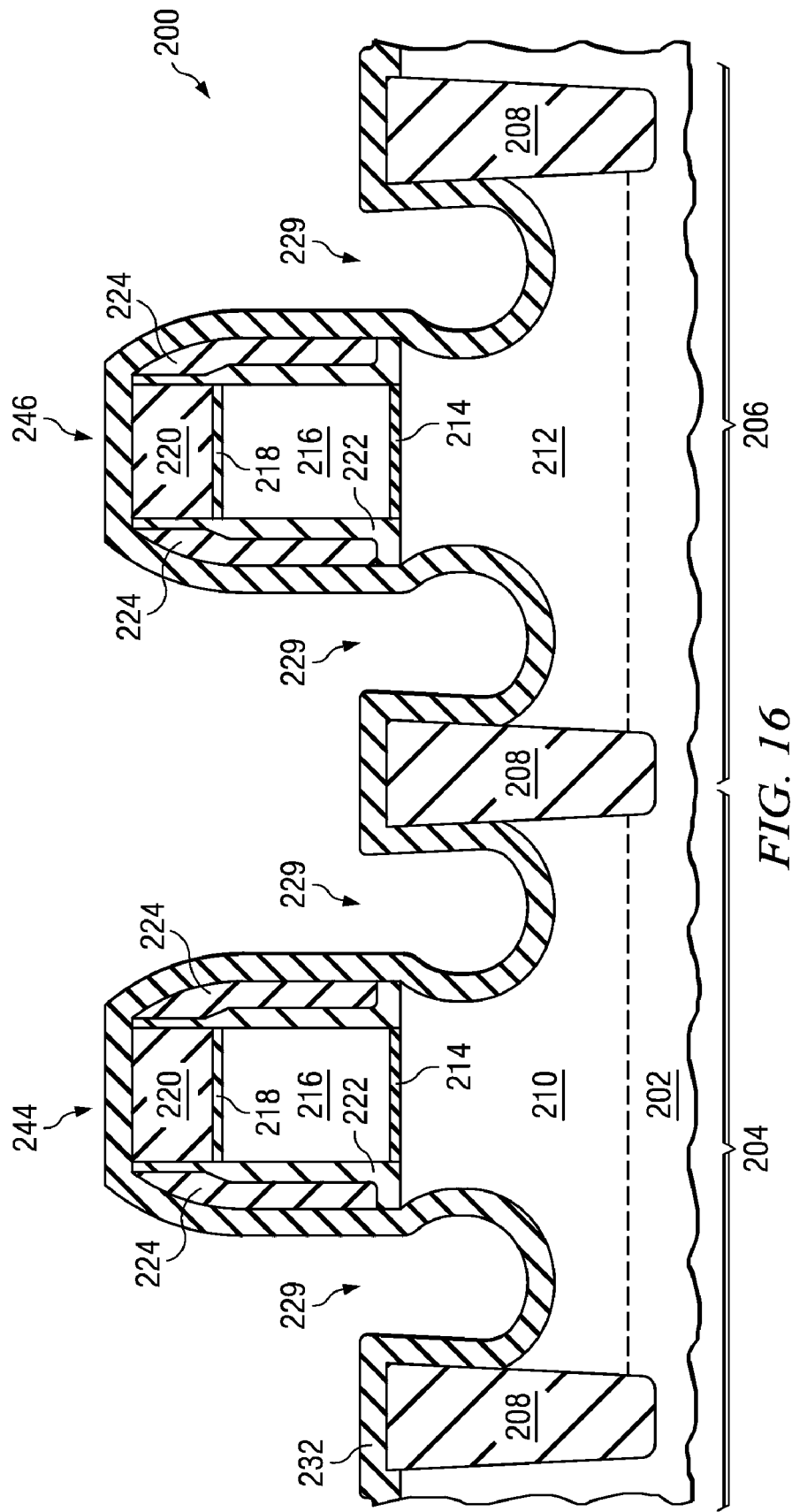
Figure 17:
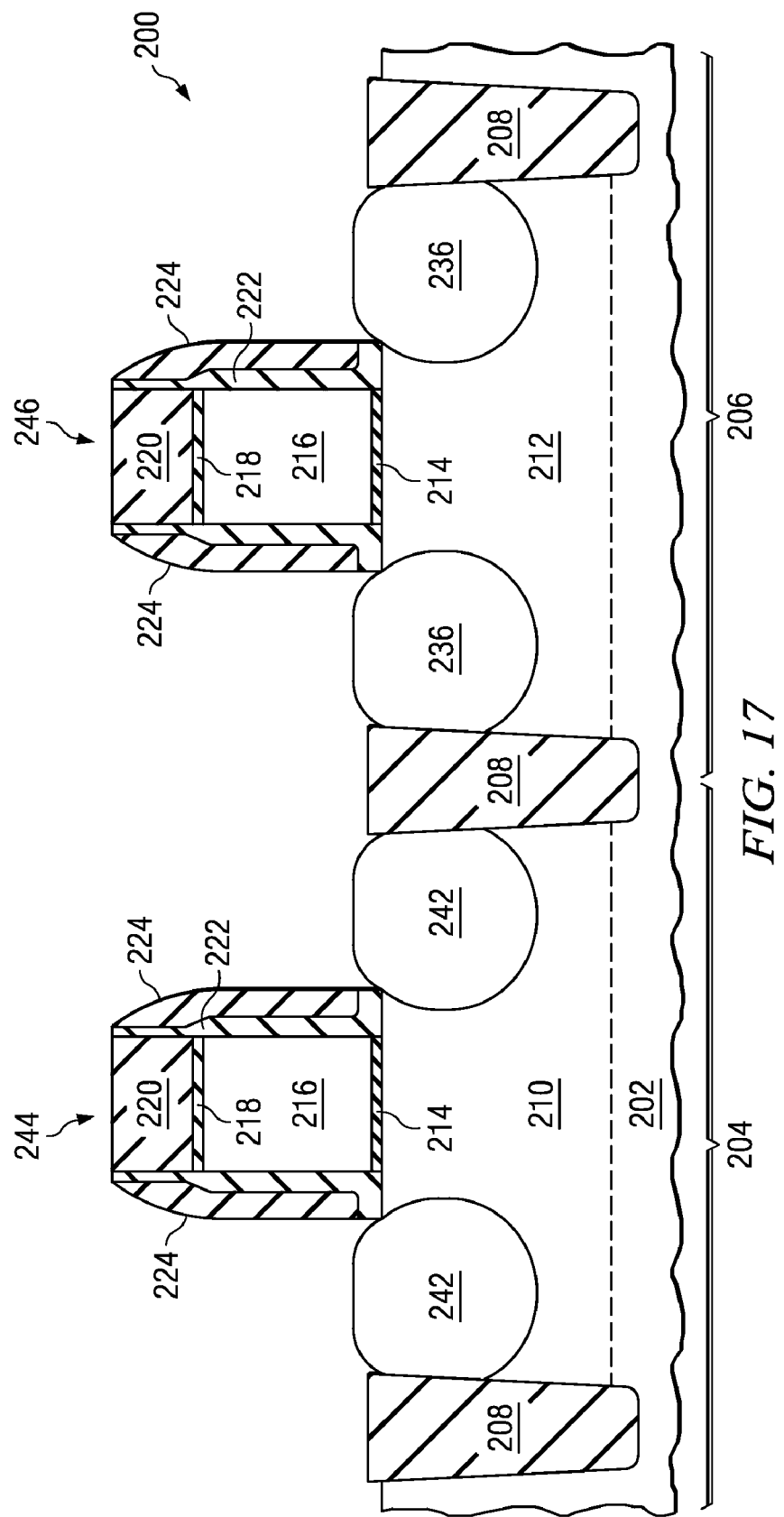

In accordance with embodiments of the present invention, exposed portions of the workpiece 102 in the first region 104 and the second region 106 are then recessed using an etch process 128, as shown in FIG. 5. The etch process 128 may comprise an anisotropic etch process adapted to etch away top portions of the workpiece 102. The etch process 128 may alternatively comprise an isotropic etch process, as shown in FIGS. 15 through 17, to be described further herein. The etch process 128 may comprise a wet or dry etch process, or combinations thereof, for example. The etch process 128 may comprise a reactive ion etch (RIE) process, as another example.

The etch process 128 may be adapted to remove the workpiece 102 material and not remove the isolation region 108 material, hard mask 118/120, or sidewall spacers 122/124, forming recesses 129 in the workpiece 102 proximate at least one side of the gate 116 and the gate dielectric 114 in the first region 104 and the second region 106 of the workpiece 102. For example, the recesses 129 may be formed proximate a first side and a second side of the gate 116 and gate dielectric 114, as shown in FIG. 5. The recesses 129 may comprise a depth beneath the top surface of the workpiece 102 comprising a depth or dimension $d_1$ of about 200 nm or less, for example. In some embodiments, for example, the recesses may comprise a depth or dimension $d_1$ beneath the top surface of the workpiece 102 of about 40 to 100 nm, as another example. The recesses 129 may comprise a width or dimension $d_2$ of about 900 nm to 1 µm or less in some embodiments, as another example. Alternatively, the recesses 129 may comprise other dimensions. The recesses 129 may comprise substantially oval, round, square, rectangular, triangular, or trapezoidal shapes, as examples, although alternatively, the recesses 129 may comprise other shapes.

The recesses 129 comprise two holes in the top surface of the workpiece 102 formed on both sides of the gate 116 and the gate dielectric 114 in the first region 104 and the second region 106 of the workpiece 102. Only two recesses 129 are shown in the figures in the first region 104 and the second region 106 of the workpiece 102; however, alternatively, a plurality of recesses 129 may simultaneously be formed (e.g., a plurality of transistors 144 and 146 may be formed at once across the surface of the workpiece 102).

In accordance with an embodiment of the present invention, the etch process 128 results in a small amount of the workpiece 102 being left remaining on the sidewalls of the recesses 129 proximate the isolation regions 108. The thickness or dimension $d_3$ of the workpiece 102 proximate the isolation regions 108 may comprise several nm, e.g., about 1 to 2 nm or greater, for example.

Advantageously, since the etch process 128 is adapted not to remove the isolation regions 108, the hard mask 118/120, or the sidewall spacers 122/124, a masking material and lithography process may not be required to form the recesses 129 in the workpiece 102. In some embodiments, forming the recesses 129 in the first region and the second region of the workpiece 102 comprises simultaneously forming the recesses 129 without using a lithography mask or a lithography process, for example.

The type of etch process 128 used determines the shape of the recesses 129 within the top surface of the workpiece 102. For example, if an anisotropic etch process 128 is used to form the recesses 129, the recesses 129 may comprise the shape shown in FIG. 5, wherein a directional, anisotropic etch component of the etch process 128 etches away the workpiece 102 preferentially in a downward direction within the workpiece 102. The recesses 129 may comprise substantially straight sidewalls if an anisotropic etch process 128 is used, as shown. The recesses 129 do not extend beneath the sidewall spacers 122/124 in this embodiment. As another example, shown in FIGS. 15 through 17, if an etch process 250 comprising an isotropic etch process or component is used, the recesses 229 may comprise the shape of a shallow or deep bowl, and less of the workpiece 202 may be etched away near the top and bottom of the recesses 229. The recesses 229 may extend beneath the sidewalls spacers 222/224, for example.

Referring again to FIG. 5, the shape of the recesses 129 determines the shape of the source and drain regions of transistors 144 and 146 (see FIG. 14) that will be formed in the first and second regions 104 and 106. Advantageously, the recesses 129 are formed in the first region 104 and in the second region 106 simultaneously and using the same etch process 129, so that the recesses 129 comprise substantially the same dimensions $d_1$ and $d_2$ and are symmetric in the first and second regions 104 and 106 of the workpiece 102. Furthermore, a lithography mask or lithography process is not required to form the recesses 129, for example, further ensuring the formation of symmetric recesses 129 in the first region 104 and the second region 106 and avoiding mis-alignment, e.g., if more than one lithography mask were to be used to form the recesses 129 in the first region 104 and the second region 106.

Figure 6:
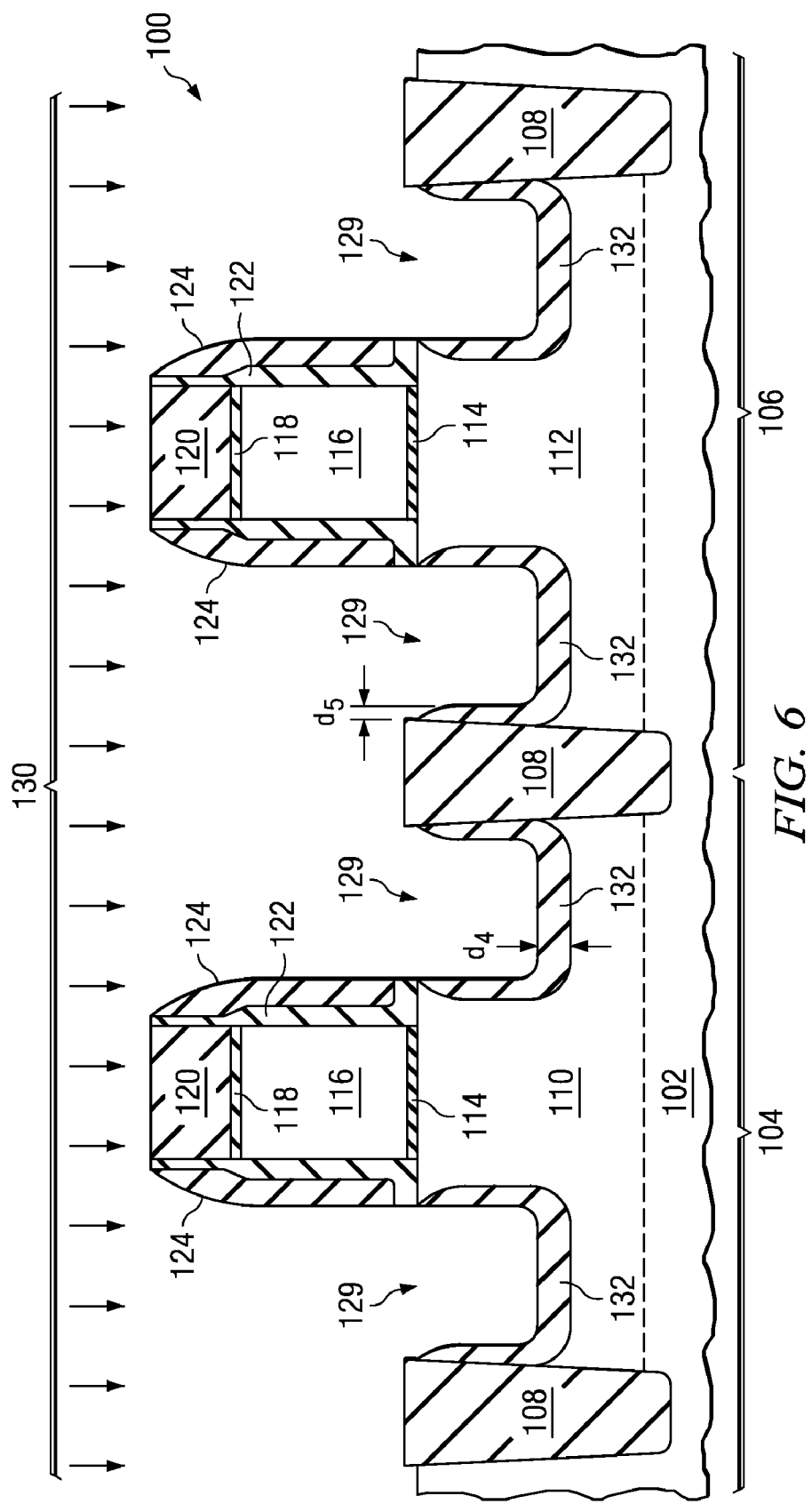
Figure 7:
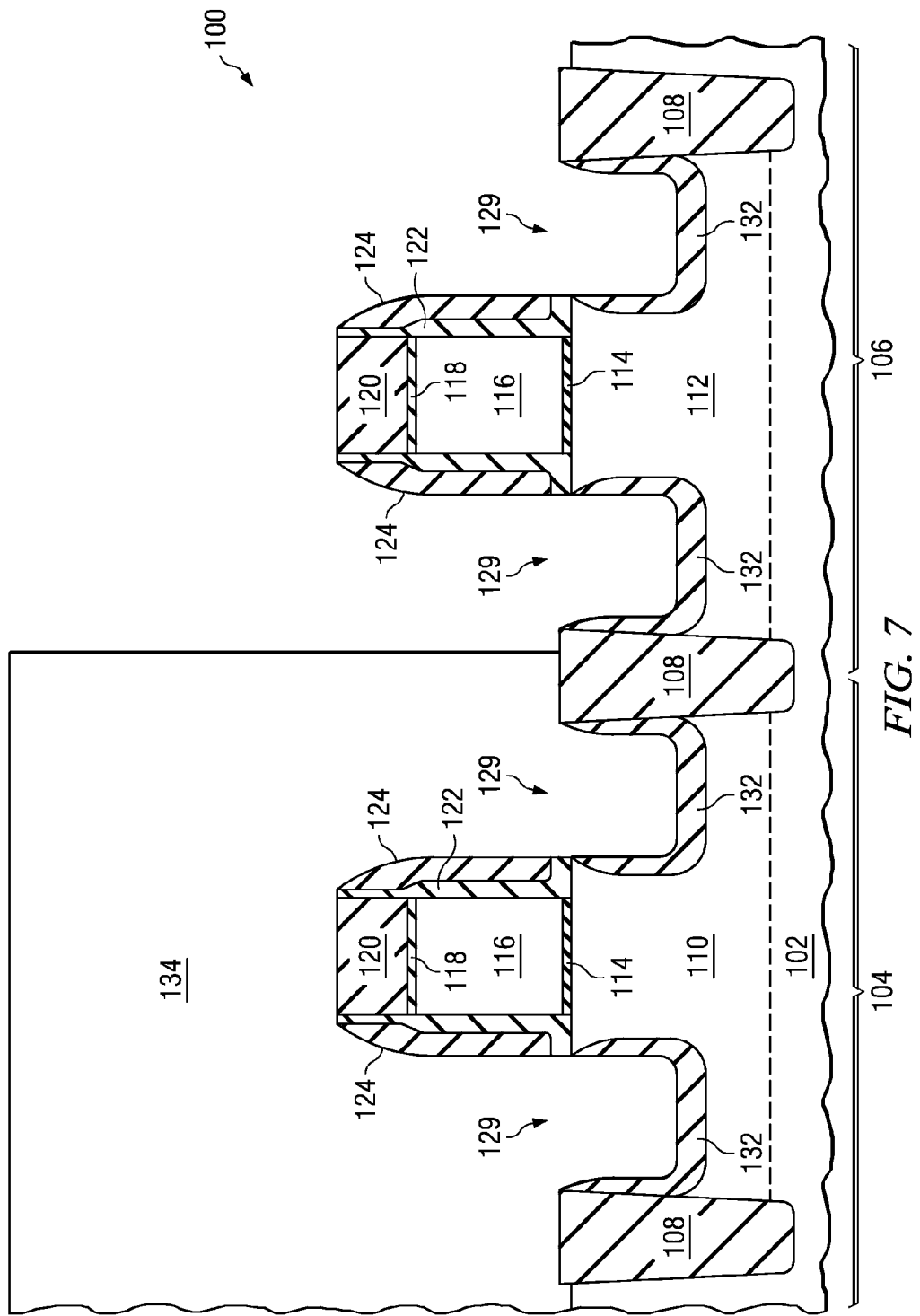
Figure 8:
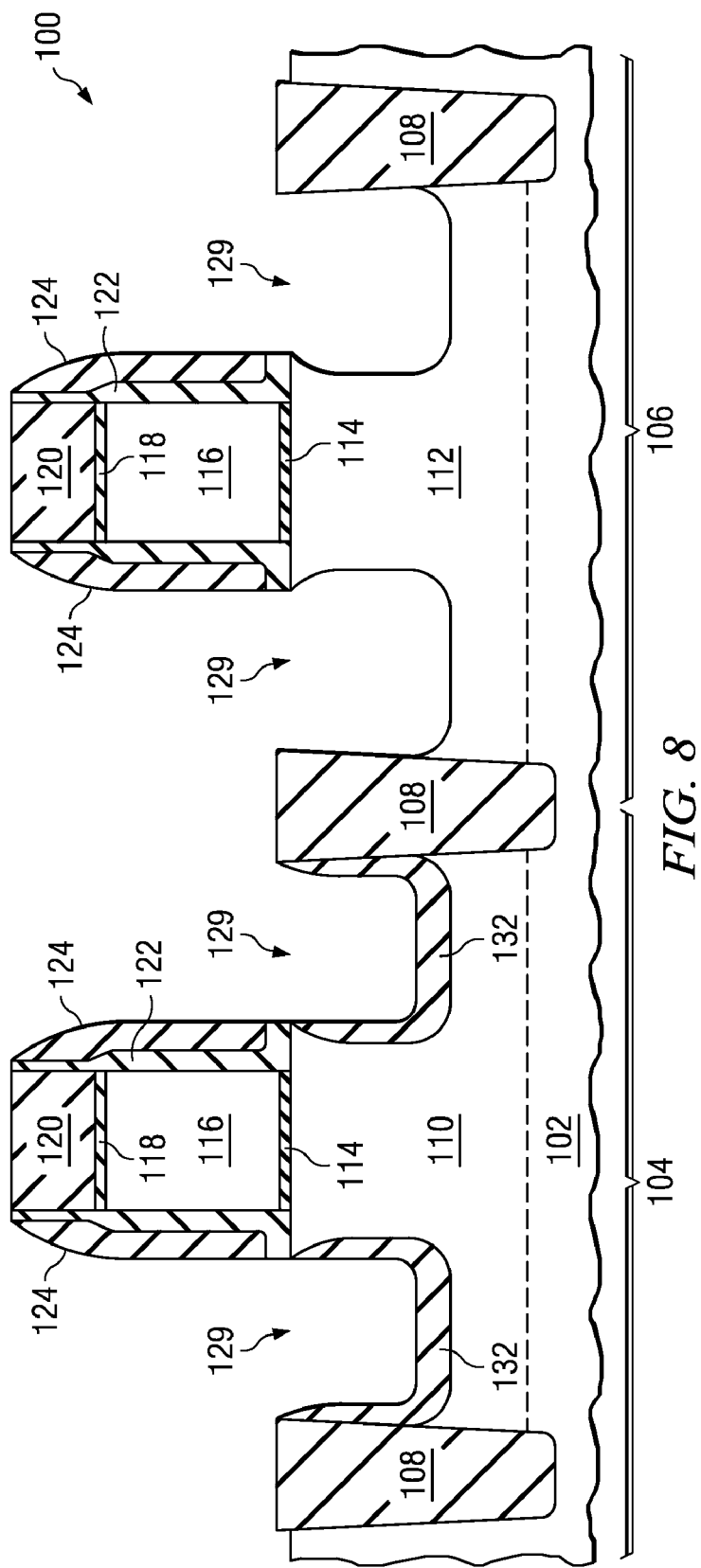
Figure 9:
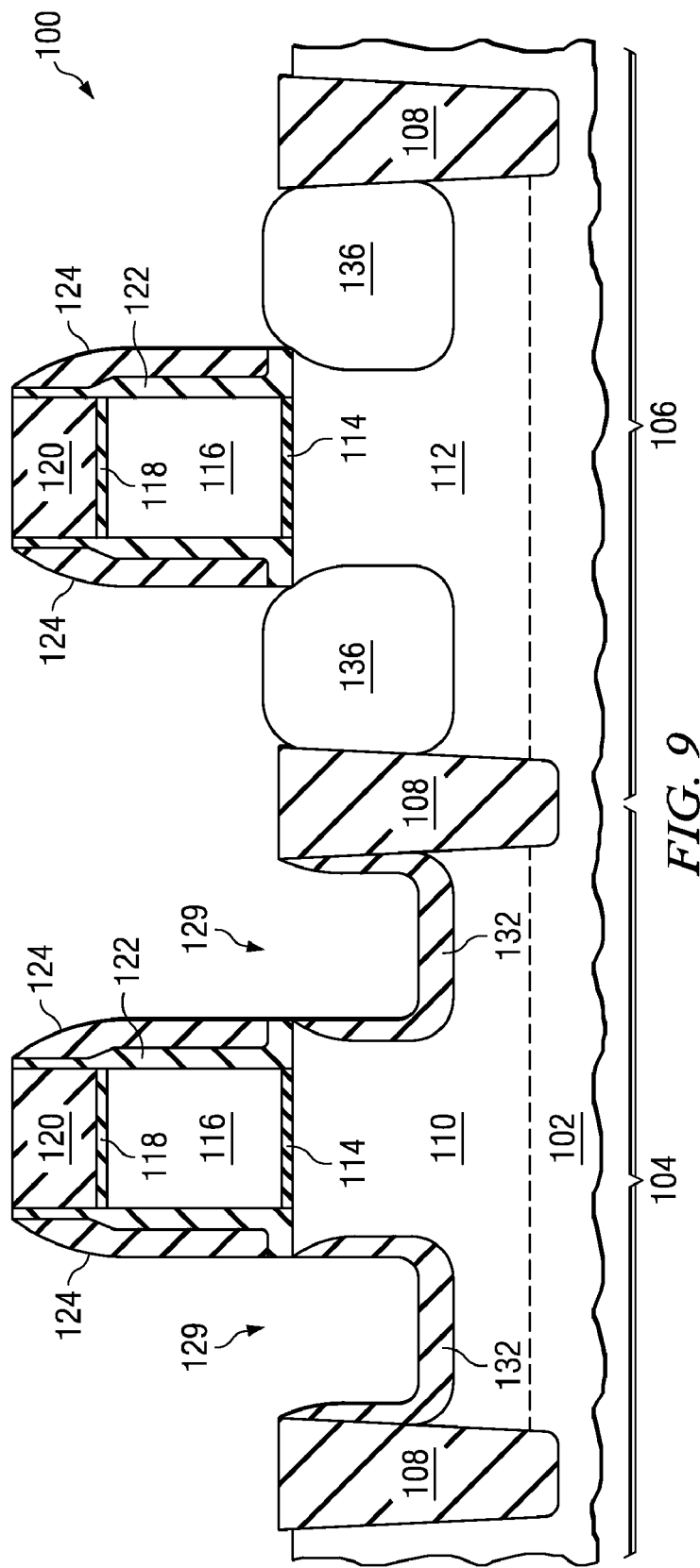

Next, the first region 104 of the workpiece 102 is masked, as shown in FIGS. 6 through 8, and the recesses 129 in the second region 106 of the workpiece 102 are filled with a first semiconductive material 136, as shown in FIG. 9. The first region 104 is masked by forming a first masking material 132 over the recesses 129 in the first region 104 and the second region 106 of the workpiece 102, and then removing the first masking material 132 from over the second region 106. The first masking material 132, also referred to herein as an oxide material, may be selectively formed over the recesses 129, e.g., by oxidizing the workpiece 102. Alternatively, the first masking material 132 may be deposited over the workpiece 102. The first masking material 132 may comprise an oxide material, a nitride material, or combinations or multiple layers thereof, for example, although alternatively, the first masking material 132 may comprise other materials.

For example, referring to FIG. 6, masking the first region 104 of the workpiece 102 may comprise, first, oxidizing exposed portions of the workpiece 102 in both the first region 104 and the second region 106 and forming the first masking material 132 comprising an oxide material within the recesses 129 in the first region 104 and the second region 106. The oxidation process 130 may comprise heating the workpiece 102 in the presence of oxygen at a temperature of about at a temperature of about 600 to 800 degrees C. for several minutes or hours, forming the oxide material 132 on the sidewalls and bottom surface of the recesses 129 in the workpiece 102. The oxide material 132 may comprise silicon dioxide formed by the combination of oxygen with silicon of the workpiece 102, for example. The oxide material 132 may consume a portion of the workpiece 102 within the recesses 129.

The oxide material 132 may comprise a thickness of about 50 nm or less, as an example, although alternatively, the oxide material 132 may comprise other dimensions. The oxide material 132 may comprise a thickness sufficient for the oxide material 132 to function as a masking material in a subsequent processing step, for example. The oxide material 132 may be thicker on sidewalls of the recesses 129 than on bottom surfaces of the recesses 129 in the workpiece 102, as shown. The oxide material 132 may comprise a thickness or dimension $d_4$ on the bottom surfaces of the recesses 129 of about 50 nm or less, as an example, and may comprise a thickness or dimension $d_5$ on the sidewalls of the recesses 129 of about 40 nm or less, as another example. Alternatively, dimension $d_4$ and dimension $d_5$ may comprise other values.

After oxidizing the workpiece 102 to form the oxide material 132, the oxide material 132 may optionally be nitrided. For example, the workpiece 102 may be heated in the presence of nitrogen at a temperature of about 600 to 800 degrees C. for several minutes or hours, forming a nitride material on the oxide material 132 on the sidewalls and bottom surface of the recesses 129 in the workpiece 102. The first masking material 132 may comprise an oxide material with a top region comprising an oxynitride material, as an example.

A layer of photosensitive material 134 comprising a photoresist, for example, is deposited over the entire workpiece 102, and the layer of photosensitive material 134 is patterned using lithography to remove the layer of photosensitive material 134 from over the second region 106 of the workpiece, as shown in FIG. 7. The layer of photosensitive material 134 is then used as a mask while the oxide material 132 is etched away or removed from the second region 106, as shown in FIG. 8. Because the oxide material 132 may consume a portion of the workpiece 102 within the recesses 129, removing the oxide material 132 from the second region 106 may result in the enlargement of the recesses 129 after the removal of the oxide material 132, for example. The layer of photosensitive material 134 is then removed, also shown in FIG. 8.

Thus, the oxide material 132 left remaining on the sidewalls and bottom surfaces of the recesses 129 in the workpiece 102 comprises a first masking material 132 in the first region 104 of the workpiece 102.

The recesses 129 in the second region 106 of the workpiece 102 are filled with a first semiconductive material 136, as shown in FIG. 9. The first semiconductive material 136 may be epitaxially grown, for example. The presence of the oxide material 132 in the recesses 129 of the first region 104 prevents the first semiconductive material 136 from forming or growing in the first region 104, for example. Thus, the oxide material 132 functions as a masking material.

The first semiconductive material 136 may comprise a compound semiconductor material. The first semiconductive material 136 may comprise two or more semiconductor elements or a semiconductor element combined with another type of element, for example. The first semiconductive material 136 may comprise SiGe or SiC, in some embodiments, although other materials may also be used. The first semiconductive material 136 may be selected to achieve the amount and type of stress desired for the particular transistor 146 device being manufactured in the second region 106, for example.

If the transistor 146 to be formed in the second region 106 comprises a p channel metal oxide semiconductor (PMOS) field effect transistor (FET), filling the recesses 129 in the workpiece 102 with the first semiconductive material 136 may comprise epitaxially growing SiGe. Alternatively, other compound semiconductive materials may also be used for the first semiconductive material 136, for example. The compound first semiconductive material 136 increases the tensile stress of the source region and the drain region of the transistor 146 in these embodiments, which creates compressive stress on the channel region proximate the source and drain regions of the transistor 146, for example.

The first semiconductive material 136 may completely fill the recesses 129 in the entire amount of the depth beneath the top surface of the workpiece 102 comprising the dimension $d_1$ of about 200 nm or less, for example. The first semiconductive material 136 may extend above a top surface of the workpiece 102 by about 10 nm or more, for example.

The first semiconductive material 136 may comprise a compound semiconductor material comprising silicon (Si) and at least one other element, for example. The other element(s) may comprise an atom having a different size than Si and/or a different atom size than the material of the workpiece 102, so that stress is created in the first semiconductive material 136 which is bounded by the workpiece 102 and the isolation regions 108, for example. The first semiconductive material 136 may comprise a material adapted to alter a stress of the workpiece 102 in a region of the workpiece 102 proximate the first semiconductive material 136 in some embodiments. In some embodiments, for example, the first semiconductive material 136 may be adapted to alter the stress of the adjacent channel region disposed between source and drain regions comprising the first semiconductive material 136.

The first semiconductive material 136 may be epitaxially grown, for example. The first semiconductive material 136 forms only on the exposed, recessed surfaces of the workpiece 102 in the epitaxial growth process. Advantageously, the hard mask 118/120 prevents the first semiconductive material 136 from forming on the top surface of the gate 116, and the oxide material 132 in the recesses 129 in the first region 104 of the workpiece 102 prevents the first semiconductive material 136 from forming in the recesses 129 of the first region 104.

To form the first semiconductive material 136 epitaxially, for example, the workpiece 102 may be placed in a processing chamber, and then gas sources may be introduced into the processing chamber to epitaxially grow the first semiconductive material 136 to fill the recesses 129 in the second region 106 of the workpiece 102. A first gas source comprising Si (e.g., $SiH_4$ or $SiH_2Cl_2$) and a second gas source comprising Ge (e.g., $GeH_4$) may be introduced into the processing chamber to form SiGe, for example. Alternatively, other gas sources may be used, and other gases may be included in the gas mixture, such as carrier gases and dopant source gases. An example of a carrier gas is HCl, although alternatively, other gases may be used.

Advantageously, because an epitaxial process is used to form the first semiconductive material 136, a lithography process to remove undesired semiconductive materials is avoided, because the first semiconductive material 136 only forms on the exposed portions of the workpiece 102 in the recesses 129 in the second region 106 of the workpiece 102, for example. Thus, the number of lithography steps and lithography mask sets required to manufacture the semiconductor device 100 is reduced or minimized by embodiments of the present invention.

Figure 10:
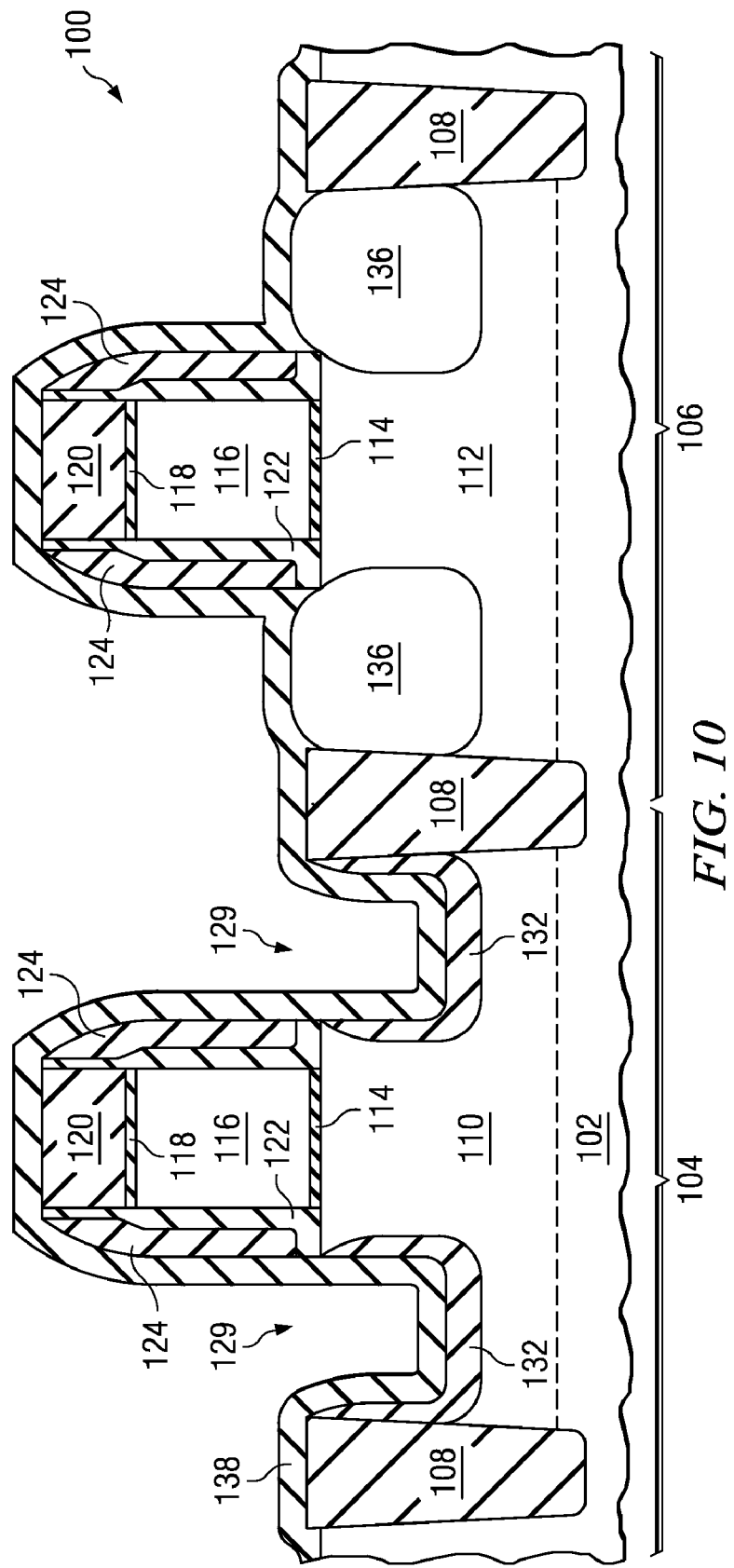

Next, the second region 106 of the workpiece 102 is masked, and the recesses 129 in the first region 104 of the workpiece 102 are filled with a second semiconductive material 142, as shown in FIGS. 10 through 13. Referring to FIG. 10, a second masking material 138 is deposited over the workpiece 102, e.g., over the top surfaces of the isolation regions 108, over the first masking material 132 in the recesses 129 in the first region 104, over the sidewall spacers 118/120, over the hard mask 118/120 over the gates 116, and over the first semiconductive material 136 within the recesses 129 in the second region 106 of the workpiece 102.

The second masking material 138 may comprise an oxide material, a nitride material, or combinations or multiple layers thereof, for example, although alternatively the second masking material 138 may comprise other materials. The second masking material 138 may comprise a thickness of about 50 nm or less, as an example, although alternatively, the second masking material 138 may comprise other dimensions. The second masking material 138 may comprise a single layer of an oxide material such as silicon dioxide in some embodiments, as another example. The second masking material 138 may be substantially conformal as deposited, as shown.

Figure 11:
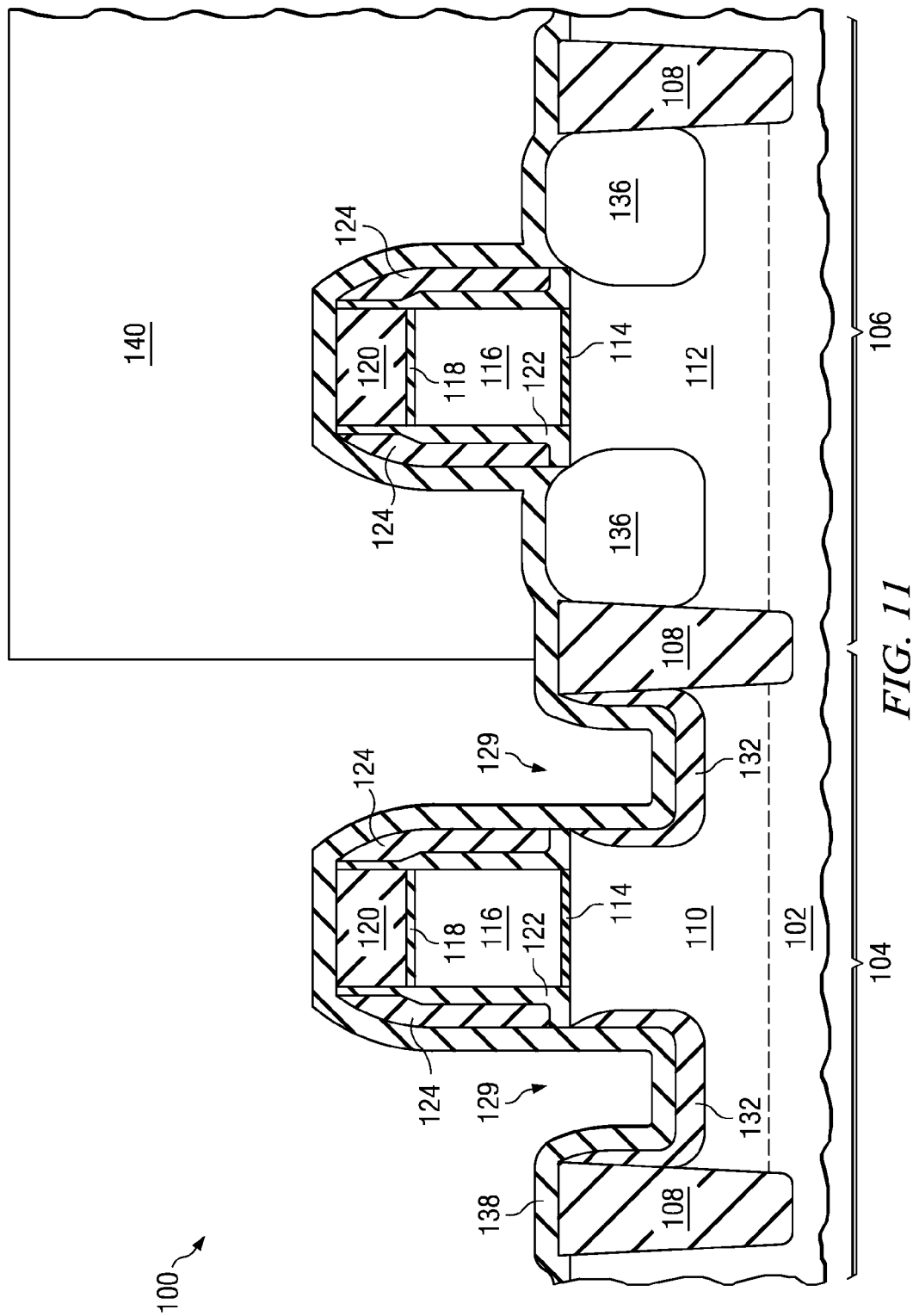
Figure 12:
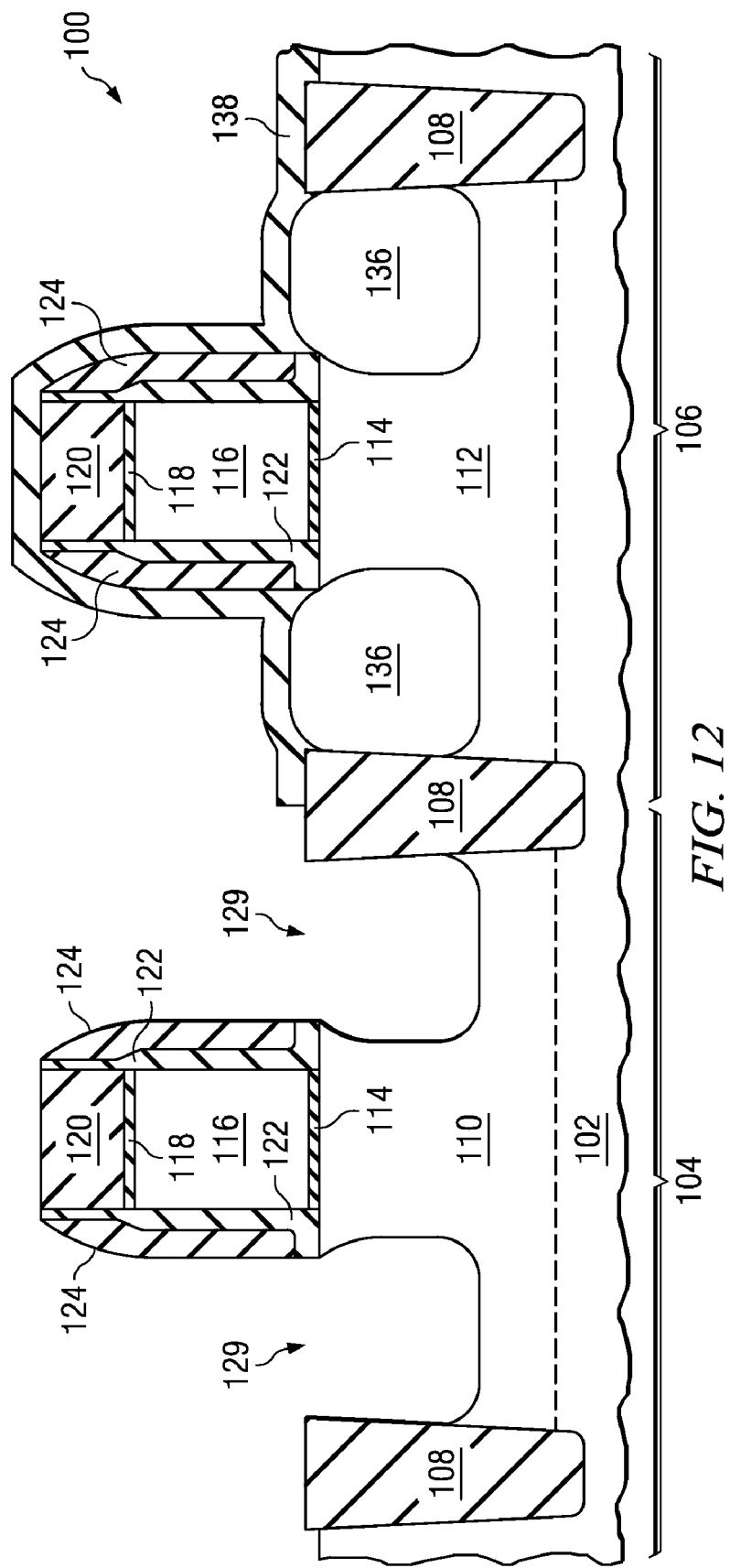

The second masking material 138 and the first masking material 132 are removed from the first region 104 of the workpiece 102, e.g., by depositing a layer of photosensitive material 140 over the entire workpiece 102, removing the layer of photosensitive material 140 from the first region 102 using a lithography process, as shown in FIG. 11, and using the layer of photosensitive material 140 as a mask while portions of the second masking material 138 and the first masking material 132 are removed from over the first region 104 of the workpiece 102 using an etch process, leaving the structure shown in FIG. 12, wherein the recesses 129 in the first region 104 of the workpiece 102 are exposed.

Because the oxide material 132 may consume a portion of the workpiece 102 within the recesses 129, removing the first masking material 132 comprising the oxide material from the first region 104 may result in the enlargement of the recesses 129 after the removal of the oxide material 132, for example. Advantageously, the enlargement of the recesses 129 in the first region 104 is substantially the same as the enlargement of the recesses 129 in the second region 106, because the first masking material 132 is formed using the same oxidation process (or deposition process, to be described further herein) in the first region 104 and the second region 106, in accordance with embodiments of the present invention.

Figure 13:
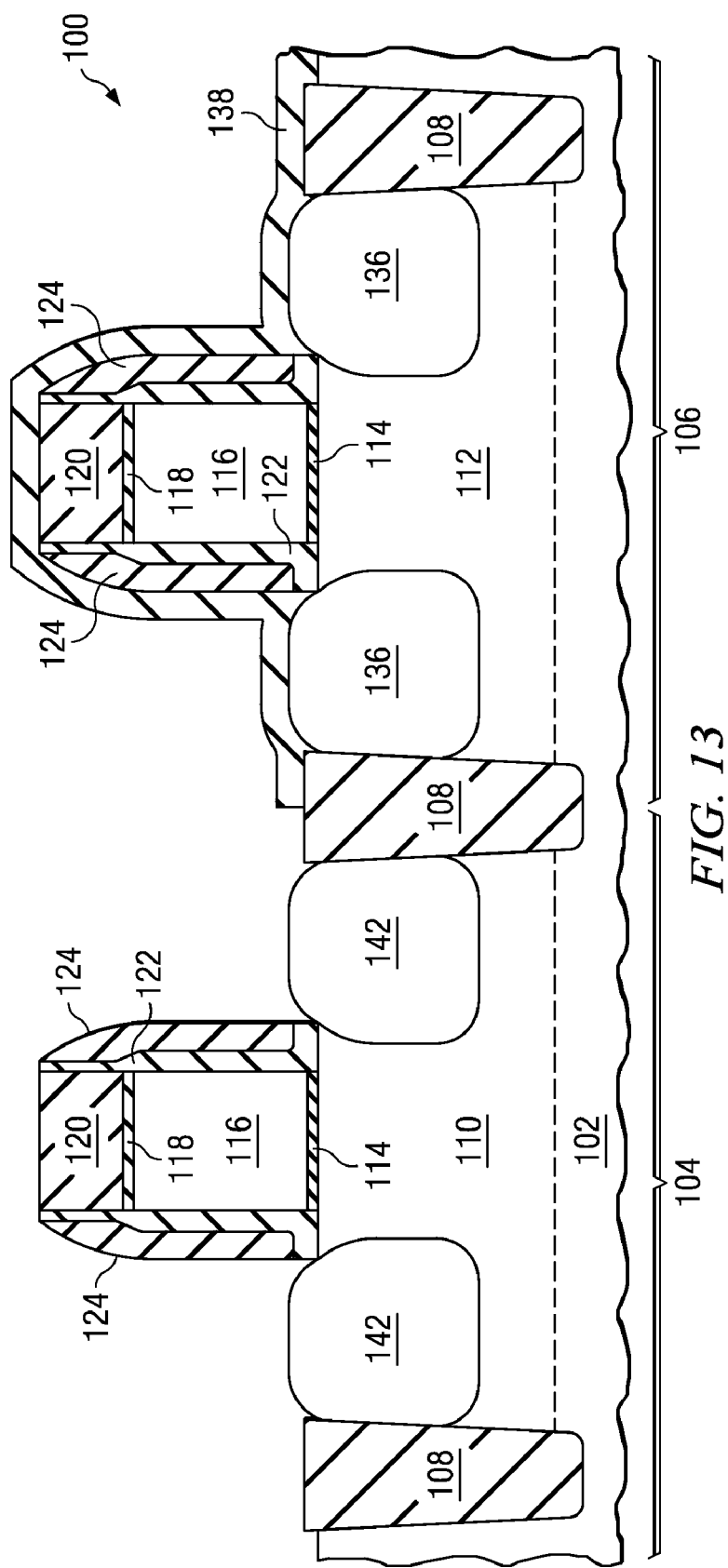

The exposed recesses 129 in the first region 104 of the workpiece 102 are filled with a second semiconductive material 142, as shown in FIG. 13. The second semiconductive material 142 may be epitaxially grown, for example. The presence of the second masking material 138 disposed over the first semiconductive material 136 in the second region 106 of the workpiece 102 prevents the second semiconductive material 142 from forming or growing in the second region 106, for example.

The second semiconductive material 142 comprises a different material than the first semiconductive material 136. The second semiconductive material 142 may comprise a compound semiconductor material. The second semiconductive material 142 may comprise two or more semiconductor elements or a semiconductor element combined with another type of element, for example. The second semiconductive material 142 may comprise SiC or SiGe, in some embodiments, although other materials may also be used. The second semiconductive material 142 may be selected to achieve the amount and type of stress desired for the particular transistor 144 device being manufactured in the first region 104 of the workpiece 102, for example.

If the transistor 144 to be formed in the first region 104 comprises an n channel metal oxide semiconductor (NMOS) field effect transistor (FET), the recesses 129 in the first region 104 of the workpiece 102 may be filled with a second semiconductive material 142 that comprises epitaxially grown SiC, for example. Alternatively, other semiconductive materials may also be used. The compound second semiconductive material 142 increases the compressive stress of the source region and the drain region of the transistor 144 in the first region 104 in these embodiments, which creates tensile stress on the channel region of the transistor 144, for example.

The second semiconductive material 142 may completely fill the recesses 129 in the entire amount of the depth beneath the top surface of the workpiece 102 comprising the dimension $d_1$ of about 200 nm or less, for example. The second semiconductive material 142 may extend above a top surface of the workpiece 102 by about 10 nm or more, for example.

The second semiconductive material 142 may comprise a compound semiconductor material comprising Si and at least one other element, for example. The other element(s) may comprise an atom having a different size than Si and/or a different atom size than the material of the workpiece 102, so that stress is created in the second semiconductive material 142 which is bounded by the workpiece 102 and the isolation regions 108, for example. The second semiconductive material 142 may comprise a material adapted to alter a stress of the workpiece 102 in a region of the workpiece 102 proximate the second semiconductive material 142 in some embodiments. In some embodiments, for example, the second semiconductive material 142 is adapted to alter the stress of the adjacent channel region disposed between source and drain regions comprising the second semiconductive material 142.

The second semiconductive material 142 is epitaxially grown so that the second semiconductive material 142 forms only on the exposed, recessed surfaces of the first region 104 of the workpiece 102 in the epitaxial growth process. Advantageously, the second masking material 138 prevents the second semiconductive material 142 from forming in the second region 104 of the workpiece 102, e.g., over the first semiconductive material 136 or the gate 116.

To form the second semiconductive material 142 epitaxially, for example, the workpiece 102 may be placed in a processing chamber, and then gas sources may be introduced into the processing chamber to epitaxially grow the second semiconductive material 142 to fill the recesses 129 in the first region 104 of the workpiece 102. A first gas source comprising Si (e.g., $SiH_4$ or $SiH_2Cl_2$) and a second gas source comprising C (e.g., $CH_3Si$) may be introduced into the processing chamber to form SiC, for example. Alternatively, other gas sources may be used, and other gases may be included in the gas mixture, such as carrier gases (e.g., HCl) and dopant source gases.

Advantageously, because an epitaxial process is used to form the second semiconductive material 142, the need for a lithography process to remove undesired semiconductive materials is avoided, because the second semiconductive material 142 only forms on the exposed portions of the workpiece 102 in the recesses 129 in the first region 104 of the workpiece 102, for example. Thus, the number of lithography steps and lithography mask sets required to manufacture the semiconductor device 100 is reduced or minimized by embodiments of the present invention.

Figure 14:
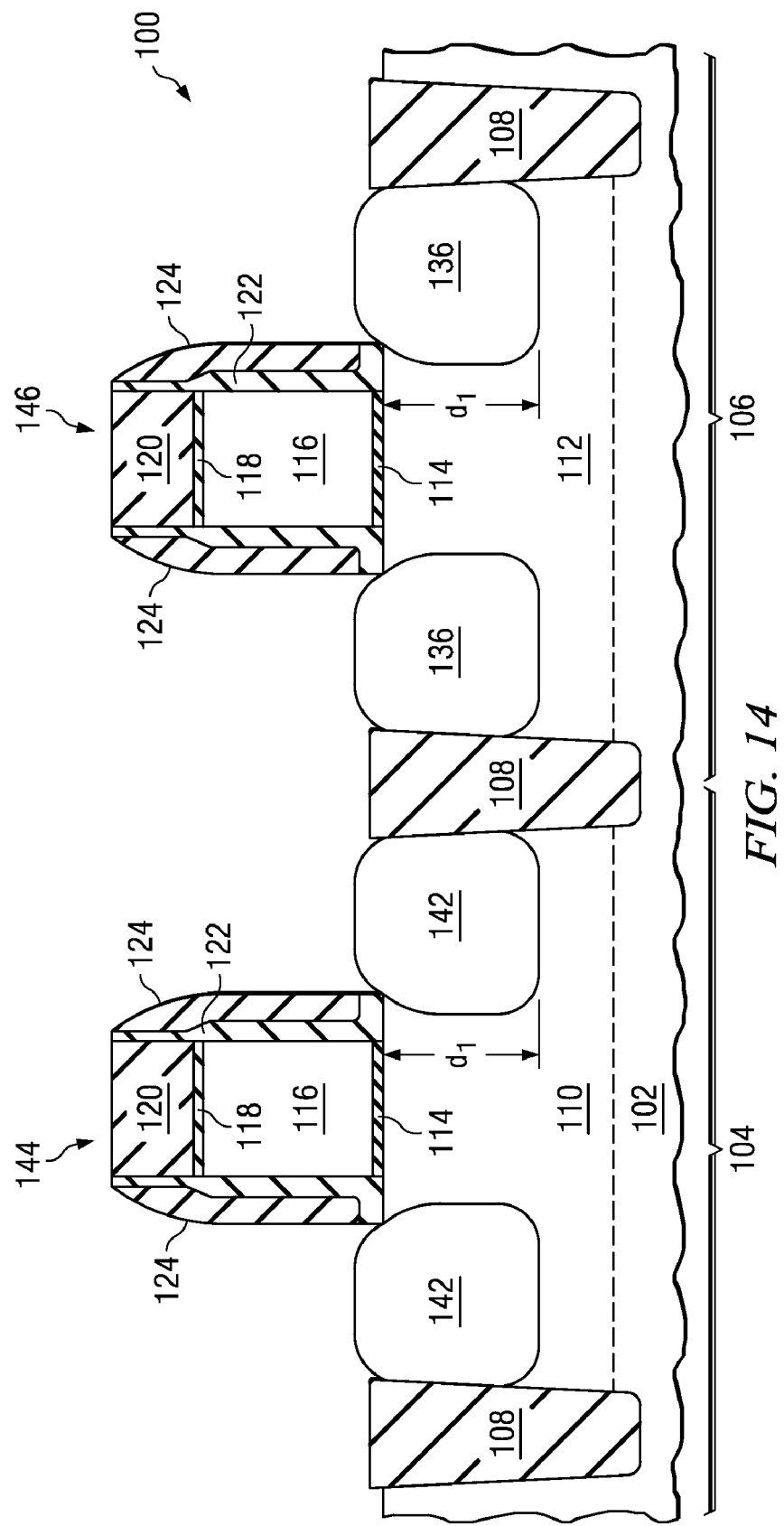

Next, the second masking material 138 is removed from over the second region 106 of the workpiece 102, as shown in FIG. 14, e.g., using an etch process. A transistor 144 is formed in the first region 104 of the workpiece 102 comprising source and drain regions comprising the second semiconductive material 142. A transistor 146 is formed in the second region 106 of the workpiece 102 comprising source and drain regions comprising the first semiconductive material 136. Advantageously, because the recesses 129 for the source and drain regions were formed simultaneously and using the same etch process 128, the source and drain regions of the transistors 144 and 146 in the first and second regions 104 and 106, respectively, are symmetric and comprise substantially the same dimensions.

The manufacturing process for the semiconductor device 100 is then continued to complete the fabrication of the semiconductor device 100. For example, additional sidewall spacers may be formed over sidewall spacers 122/124. The top surfaces of the first or second semiconductive materials 136 or 142 or the workpiece 102 may optionally be implanted with dopants to form pocket implants, halo implants, or double-diffused regions, for example. Doped or implanted portions (not shown) of the first or second semiconductive materials 136 or 142 or workpiece 102 may also comprise a part of the source and drain regions of the transistors 144 and 146, for example.

Optional silicide regions (not shown) may be formed over the source and drain regions, e.g., over the first or second semiconductive materials 136 or 142 and/or over the gate 116. For example, the hard mask 118/120 may be removed, and silicide regions may be formed by depositing a silicidation metal over the gate, source and drain regions, e.g., over all exposed surfaces of the structure. The silicidation metal may comprise nickel, cobalt, or other metals, as examples. After the metal is deposited over the source and drain regions and optionally also over the gate 116, the workpiece 102 is heated, causing the metal to diffuse into the semiconductive materials 136 and 142 and the gate 116. A silicide region comprising a silicide of the metal is formed over the semiconductive materials 134 and 142 and/or gate 116. After the silicide regions are formed, the layer of silicidation metal is then removed from the semiconductor device 100. The optional silicide regions improve the conductivity and reduce the resistance of the source, drain, and gate 116, for example.

Optional stress-inducing nitride layers which may also function as contact etch stop layers may be formed over the transistors 144 and 146 at this point (not shown). The stress-inducing nitride layers may further induce stress in the channel regions of the transistors 144 and 146. A different stress material may be formed over the NFET 144 than over the PFET 146, for example. An interlayer dielectric (ILD) layer (also not shown) comprising an insulating material may then be formed over the nitride layer or over the transistors 144 and 146. The ILD layer is patterned to form contact holes using lithography, and source and drain contacts (also not shown) are formed through the ILD layer by depositing conductive material to fill the contact holes and make electrical contact to the source/drain regions and the gates 116. Metallization layers (not shown) may be disposed above the ILD layer and the source, drain, and gate contacts to interconnect the various components of the semiconductor device 100. Other insulating materials and conductive materials may be formed over the transistors 144 and 146 and may be patterned to make electrical contact to portions of the transistors 144 and 146, for example, also not shown.

In the embodiment shown in FIGS. 1 through 14, the source and drain regions of transistors 144 and 146 in the first region 104 and the second region 106, respectively, of a workpiece 102 are recessed using an anisotropic etch process 128, and the recesses 129 are filled with semiconductive materials 142 and 136, respectively. FIGS. 15 through 17 show cross-sectional views of a semiconductor device 200 in accordance with another embodiment of the present invention, wherein the etch process 250 used to recess the workpiece 202 in the source and drain regions comprises an isotropic etch process. Like numerals are used for the various elements that were described in FIGS. 1 through 14. To avoid repetition, each reference number shown in FIGS. 15 through 17 is not described again in detail herein. Rather, similar element numbers x02, x04, x06, x08, etc. . . . are used to describe the various material layers shown as were used to describe FIGS. 1 through 14, where x=1 in FIGS. 1 through 14 and x=2 in FIGS. 15 through 17. As an example, the materials, methods of formation thereof, and dimensions described for the first and semiconductive materials 136 and 142 in the description for FIGS. 1 through 14 may also be used for semiconductive materials 236 and 242 shown in FIGS. 15 through 17.

Referring next to FIG. 15, after the etch process 126 to form sidewall spacers 122/124 shown in FIG. 4, an etch process 250 comprising an isotropic or non-directional etch process may be used to form the recesses 229 in the workpiece 202. The etch process 250 results in the formation of recesses 229 in a top portion of the workpiece 202 that are rounded and may comprise a shallow bowl shape. The sidewalls of the recesses 229 are curved inwardly and may undercut the sidewall spacers 222/224. The recesses 229 may comprise a depth comprising dimension $d_1$ that is substantially the same as a width $d_2$, as shown. Dimensions $d_1$ and $d_2$ may comprise about 40 to 100 nm, as examples, although dimensions $d_1$ and $d_2$ may alternatively comprise other dimensions. The recesses 229 may extend slightly beneath the sidewall spacers 222/224, e.g., by several nm. The etch process 250 may result in the removal of the workpiece 202 material adjacent the sidewalls of the isolation regions 208, as shown.

In this embodiment, a deposition process may be used to form the first masking material 232, as shown in FIG. 16. The first masking material 232 may be substantially conformal as deposited, as shown. A deposition process may also be used to form the first masking material 132 in the embodiment shown in FIGS. 1 through 14, for example.

After the deposition of the first masking material 232, the fabrication process of the semiconductor device 200 is continued as described with respect to FIGS. 7 through 14. The semiconductor device 200 is shown in FIG. 17 after the formation of the first semiconductive material 236 in the recesses 229 of the second region 206 of the workpiece 202 and the second semiconductive material 2242 in the recesses 229 of the second region 204 of the workpiece 202, as described with reference to the previous embodiment shown in FIGS. 1 through 14, for example.

Note that in some embodiments of the present invention, the isolation regions 108 and 208 may be recessed below the top surface of the workpiece 102 and 202, not shown in the drawings.

Embodiments of the present invention may be implemented in multiple transistor applications such as CMOS devices that include the NMOS transistors 144 and 244 and PMOS transistors 146 and 246 described herein. Embodiments of the present invention may also be implemented in other transistor applications, for example. The semiconductive materials 136, 236, 142 and 242 comprise compound materials that may be selected to achieve the amount and type of stress desired for the particular transistors 144, 146, 244, and 246 formed, tailoring the stress needs for the devices 100 and 200 and improving device 100 and 200 performance. The transistor 144, 146, 244, and 246 performance may be improved by the inclusion of the first and second semiconductive materials 136, 236, 142, and 242 in the source and drain regions, enhancing carrier mobility of the channel regions proximate the source and drain regions.

Embodiments of the present invention may be implemented in applications where transistors are used, as described herein and shown in the figures. One example of a memory device that embodiments of the present invention may be implemented in that uses both PMOS FET's and NMOS FET's is a static random access memory (SRAM) device. A typical SRAM device includes arrays of thousands of SRAM cells, for example. Each SRAM cell may have four or six transistors (for example). A commonly used SRAM cell is a six-transistor (6T) SRAM cell, which has two PMOS FET's interconnected with four NMOS FET's. The novel methods of forming source and drain regions and structures thereof described herein may be implemented in the transistors of SRAM devices and other memory devices, for example.

Embodiments of the present invention include methods of fabricating the semiconductor devices 100 and 200 and transistors 144, 146, 244, and 246 described herein, for example. Embodiments of the present invention also include semiconductor devices 100 and 200 and transistors 144, 146, 244, and 246 manufactured using the methods described herein.

Advantages of embodiments of the invention include providing novel structures and methods for forming source and drain regions of transistors 144, 146, 244, and 246. Novel integrations schemes for forming transistors 144, 146, 244, and 246 having different compound semiconductive materials in source and drain regions in various regions of a semiconductor device 100 or 200 are described herein.

Embodiments of the present invention are easily implementable in existing manufacturing process flows, with a small or reduced number of additional processing steps being required, for example.

The first semiconductive materials 136 and 236 and second semiconductive material 142 and 242 comprising an amount and type of stress that it is desired to introduce to the channel region of the transistors 144, 146, 244, and 246 are advantageously placed close to the channel regions using the novel manufacturing process flows described herein.

Because the recesses 129 and 229 are formed simultaneously in the first region 104 and 204 of the workpiece 102 and 202 and in the second region 106 and 206 of the workpiece 102 and 202 and without the use of a lithography mask or lithography process, a symmetric cavity profile (e.g., of the recesses 129 and 229) is achieved, which is an advantage for uniaxial stress engineering. Thus, when the cavities or recesses 129 and 229 are filled with the first and second semiconductive materials 136, 236, 142, and 242, a maximum performance gain is achievable. Dual embedded epitaxial grown stress engineering of SiC and SiGe source and drain regions for NFETs and PFETs of CMOS devices is achieved by the novel methods described herein, for example. Furthermore, because the recesses 129 and 229 in the first region 104 and 204 and second region 106 and 206 of the workpiece 102 and 202 are formed without lithography masks or processes, the need for additional lithography processes is avoided, and misalignment of lithography masks during the formation of the recesses 129 and 229 is also avoided.

Because the first masking material 132 and 232 in some embodiments may consume a portion of the workpiece 102 and 202, the formation and subsequent removal of the first masking material 132 and 232 from the first region 104 and 204 and second region 106 and 206 may result in an enlargement of the recesses 129 and 229, for example. Advantageously, the enlargement of the recesses 129 and 229 in the first region 104 and 204 is substantially the same as the enlargement of the recesses 129 and 220 in the second region 106 and 206, because the first masking material 132 and 232 is formed using the same oxidation process or deposition process in the first region 104 and 204 and the second region 106 and 206, achieving a symmetric cavity profile of the recesses 129 and 229 after the removal of the first masking material 132 and 232.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming recesses in a first region and a second region of a workpiece;
    masking the first region of the workpiece, wherein masking the first region of the workpiece comprises:
        oxidizing the recesses in the first region and the second region of the workpiece thereby forming an oxide material over sidewalls and bottom surfaces of the recesses, and
        removing the oxide material from the second region of the workpiece;
    filling the recesses in the second region of the workpiece with a first semiconductive material;
    masking the second region of the workpiece; and
    filling the recesses in the first region of the workpiece with a second semiconductive material.

2. The method according to claim 1, wherein filling the recesses in the second region of the workpiece with the first semiconductive material and filling the recesses in the first region of the workpiece with the second semiconductive material comprise forming source and drain regions of a plurality of transistors.

3. The method according to claim 1, wherein masking the first region of the workpiece further comprises nitriding the oxide material in the recesses in the first region and the second region of the workpiece, forming a nitride material over the oxide material, and removing the nitride material from the second region of the workpiece.

4. A method of manufacturing a semiconductor device, the method comprising:
    forming recesses in a first region and a second region of a workpiece;
    masking the first region of the workpiece;
    filling the recesses in the second region of the workpiece with a first semiconductive material;
    masking the second region of the workpiece, wherein masking the second region of the workpiece comprises depositing an oxide material, a nitride material, or combinations or multiple layers thereof over the first region and the second region of the workpiece, and removing at least the oxide material, the nitride material, or the combinations or multiple layers thereof from the first region of the workpiece; and
    filling the recesses in the first region of the workpiece with a second semiconductive material.

5. The method according to claim 1, wherein filling the recesses in the first region of the workpiece with the second semiconductive material comprises forming a different material than the first semiconductive material in the recesses in the second region of the workpiece.

6. The method according to claim 1, wherein forming the recesses in the first region and the second region of the workpiece comprises forming the recesses without using a lithography mask or a lithography process.

7. A semiconductor device manufactured in accordance with claim 1.

8. A method of manufacturing a semiconductor device, the method comprising:
    providing a workpiece, the workpiece having a first region and a second region;
    forming a gate dielectric material over the workpiece;
    forming a gate material over the gate dielectric material;
    patterning the gate material and the gate dielectric material, forming a gate of a first transistor in the first region of the workpiece and forming a gate of a second transistor in the second region of the workpiece;
    forming recesses in the first region and the second region of the workpiece proximate the gate and the gate dielectric of the first and second transistor;
    masking the first region of the workpiece, wherein masking the first region of the workpiece comprises:
        oxidizing the recesses in the first region and the second region of the workpiece thereby forming an oxide material over sidewalls and bottom surfaces of the recesses, and
        removing the oxide material from the second region of the workpiece;
    filling the recesses in the second region of the workpiece with a first semiconductive material;
    masking the second region of the workpiece; and
    filling the recesses in the first region of the workpiece with a second semiconductive material.

9. The method according to claim 8, wherein forming the recesses in the first region of the workpiece and the second region of the workpiece comprises forming recesses in the second region of the workpiece that are symmetric to the recesses in the first region of the workpiece.

10. The method according to claim 8, wherein forming the recesses in the first region and the second region of the workpiece comprises an isotropic etch process.

11. The method according to claim 8, wherein forming recesses in the first region and the second region of the workpiece comprises an anisotropic etch process.

12. The method according to claim 8, wherein filling the recesses in the second region of the workpiece with the first semiconductive material or filling the recesses in the first region of the workpiece with the second semiconductive material comprises forming a compound semiconductor material.

13. The method according to claim 8, wherein the method includes forming a first transistor in the first region comprising an n channel metal oxide semiconductor field effect transistor (NFET) device of a complementary metal oxide semiconductor (CMOS) device and forming a second transistor in the second region comprising a p channel metal oxide semiconductor field effect transistor (PFET) device of the CMOS device.

14. The method according to claim 13, wherein filling the recesses in the second region of the workpiece with the first semiconductive material comprises filling the recesses with a material comprising tensile stress, and wherein filling the recesses in the first region of the workpiece with the second semiconductive material comprises filling the recesses with a material comprising compressive stress.

15. The method according to claim 13, wherein filling the recesses in the second region of the workpiece with the first semiconductive material comprises filling the recesses with SiGe, and wherein filling the recesses in the first region of the workpiece with the second semiconductive material comprises filling the recesses with SiC.

16. A method of manufacturing a semiconductor device, the method comprising: providing a workpiece, the workpiece having a first region and a second region;
    forming an isolation region in the workpiece at least between the first region and the second region of the workpiece;
    forming a gate dielectric material over the workpiece;
    forming a gate material over the gate dielectric material;
    forming a hard mask over the gate material;
    patterning the hard mask, the gate material, and the gate dielectric material, forming a gate and a gate dielectric of a first transistor in the first region of the workpiece and forming a gate and a gate dielectric of a second transistor in the second region of the workpiece;
    forming sidewall spacers over the hard mask, the gate material, and the gate dielectric material;
    forming recesses in the first region and the second region of the workpiece proximate the sidewall spacers;
    forming a first masking material over the recesses in the first region and the second region of the workpiece, wherein forming the first masking material over the recesses in the first region and the second region of the workpiece comprises selectively forming or selectively depositing the first masking material over the recesses in the first region and the second region of the workpiece;
    removing the first masking material from over the second region of the workpiece;
    filling the recesses in the second region of the workpiece with a first semiconductive material;
    depositing a second masking material over the first region and the second region of the workpiece;
    removing the second masking material and the first masking material from over the first region of the workpiece; and
    filling the recesses in the first region of the workpiece with a second semiconductive material.

17. The method according to claim 16, wherein filling the recesses in the second region of the workpiece with the first semiconductive material or filling the recesses in the first region of the workpiece with the second semiconductive material comprises epitaxially growing a material.

18. The method according to claim 16, wherein forming the hard mask comprises forming an oxide material layer over the gate material and forming a nitride material layer over the oxide material layer.

19. The method according to claim 16, wherein forming the first masking material or depositing the second masking material comprises forming an oxide material, a nitride material, or combinations or multiple layers thereof.

20. The method according to claim 16, wherein forming the sidewall spacers comprises:
    forming an oxide material over the patterned hard mask, gate material, and gate dielectric material;
    forming a nitride material over the oxide material; and
    anisotropically etching the nitride material and the oxide material, forming the sidewall spacers.

21. The method according to claim 16, wherein forming the recesses in the first region and the second region of the workpiece comprises forming recesses that extend into a top surface of the workpiece by about 200 nm or greater.

22. The method according to claim 17, wherein forming the recesses in the first region and the second region of the workpiece comprises simultaneously forming the recesses in the first region and the second region of the workpiece.

* * * * *

UNITED STATES PATENT AND TRADEMARK OFFICE
CERTIFICATE OF CORRECTION

PATENT NO. : 7,838,372 B2  Page 1 of 1
APPLICATION NO. : 12/125238
DATED : November 23, 2010
INVENTOR(S) : Han It is certified that error appears in the above-identified patent and that said Letters Patent is hereby corrected as shown below:

In the Claims

Col. 18, line 36, claim 22, delete "claim 17" and insert --claim 16--.

Signed and Sealed this
Eighteenth Day of November, 2014

Michelle K. Lee
*Deputy Director of the United States Patent and Trademark Office*